United States Patent
Aikawa et al.

(10) Patent No.: US 11,335,422 B2
(45) Date of Patent: May 17, 2022

(54) SEMICONDUCTOR MEMORY DEVICE AND MEMORY SYSTEM

(71) Applicant: Kioxia Corporation, Tokyo (JP)

(72) Inventors: Hisanori Aikawa, Seoul (KR); Eiji Kitagawa, Seoul (KR)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/016,272

(22) Filed: Sep. 9, 2020

(65) Prior Publication Data

US 2021/0287755 A1    Sep. 16, 2021

(30) Foreign Application Priority Data

Mar. 12, 2020 (JP) .............................. JP2020-042786

(51) Int. Cl.
| | |
|---|---|
| G11C 7/02 | (2006.01) |
| G11C 16/34 | (2006.01) |
| G11C 16/04 | (2006.01) |
| G11C 16/26 | (2006.01) |
| G11C 16/30 | (2006.01) |
| G11C 16/12 | (2006.01) |

(52) U.S. Cl.
CPC ............ *G11C 16/3459* (2013.01); *G11C 7/02* (2013.01); *G11C 16/0433* (2013.01); *G11C 16/12* (2013.01); *G11C 16/26* (2013.01); *G11C 16/30* (2013.01); *G11C 16/3404* (2013.01)

(58) Field of Classification Search
CPC ..... G11C 16/3459; G11C 16/12; G11C 16/30; G11C 16/0433; G11C 16/3404; G11C 16/26

See application file for complete search history.

(56) References Cited

U.S. PATENT DOCUMENTS

| | | | | |
|---|---|---|---|---|
| 2009/0046523 A1* | 2/2009 | Maki | ...................... | G11C 29/83 365/200 |
| 2010/0238704 A1* | 9/2010 | Komura | .............. | H01L 27/2409 365/148 |

(Continued)

FOREIGN PATENT DOCUMENTS

WO     2018190071 A1    10/2018

OTHER PUBLICATIONS

U.S. Appl. No. 16/813,827; First Named Inventor: Taiga Isoda; Title: "Magnetoresistive Memory Device"; filed Mar. 10, 2020.

(Continued)

*Primary Examiner* — Jay W. Radke

(74) *Attorney, Agent, or Firm* — Holtz, Holtz & Volek PC

(57) ABSTRACT

A semiconductor memory device includes: a first memory cell and switching element coupled in series between a first and second interconnect; a second memory cell and switching element coupled in series between the first and a third interconnect; a third memory cell and switching element coupled in series between the first and a fourth interconnect; and a control circuit. The control circuit is configured to: in a first operation on the first memory cell, upon receipt of a first command, apply a third voltage between the first and second voltage to the third and fourth interconnect; and upon receipt of a second command, apply the first and third voltage to the fourth and third interconnect, respectively.

20 Claims, 15 Drawing Sheets

(56) References Cited

U.S. PATENT DOCUMENTS

| | | | |
|---|---|---|---|
| 2012/0170353 A1* | 7/2012 | Iijima | H01L 45/08 |
| | | | 365/148 |
| 2018/0174668 A1 | 6/2018 | Nigam et al. | |
| 2019/0295643 A1 | 9/2019 | Tsukamoto | |
| 2020/0052040 A1 | 2/2020 | Nonoguchi et al. | |
| 2021/0020242 A1* | 1/2021 | Yoon | G11C 13/0028 |

OTHER PUBLICATIONS

U.S. Appl. No. 16/816,880; First Named Inventor: Tadaaki Oikawa; Title: "Magnetic Device"; filed Mar. 12, 2020.
U.S. Appl. No. 16/816,961; First Named Inventor: Kazuya Sawada; Title: "Magnetic Memory Device" filed Mar. 12, 2020.
U.S. Appl. No. 17/016,230; First Named Inventor: Kazuya Sawada; Title: "Magnetic Memory Device" filed Sep. 9, 2020.
U.S. Appl. No. 17/016,256; First Named Inventor: Taiga Isoda; Title: "Memory Device"; filed Sep. 9, 2020.

* cited by examiner

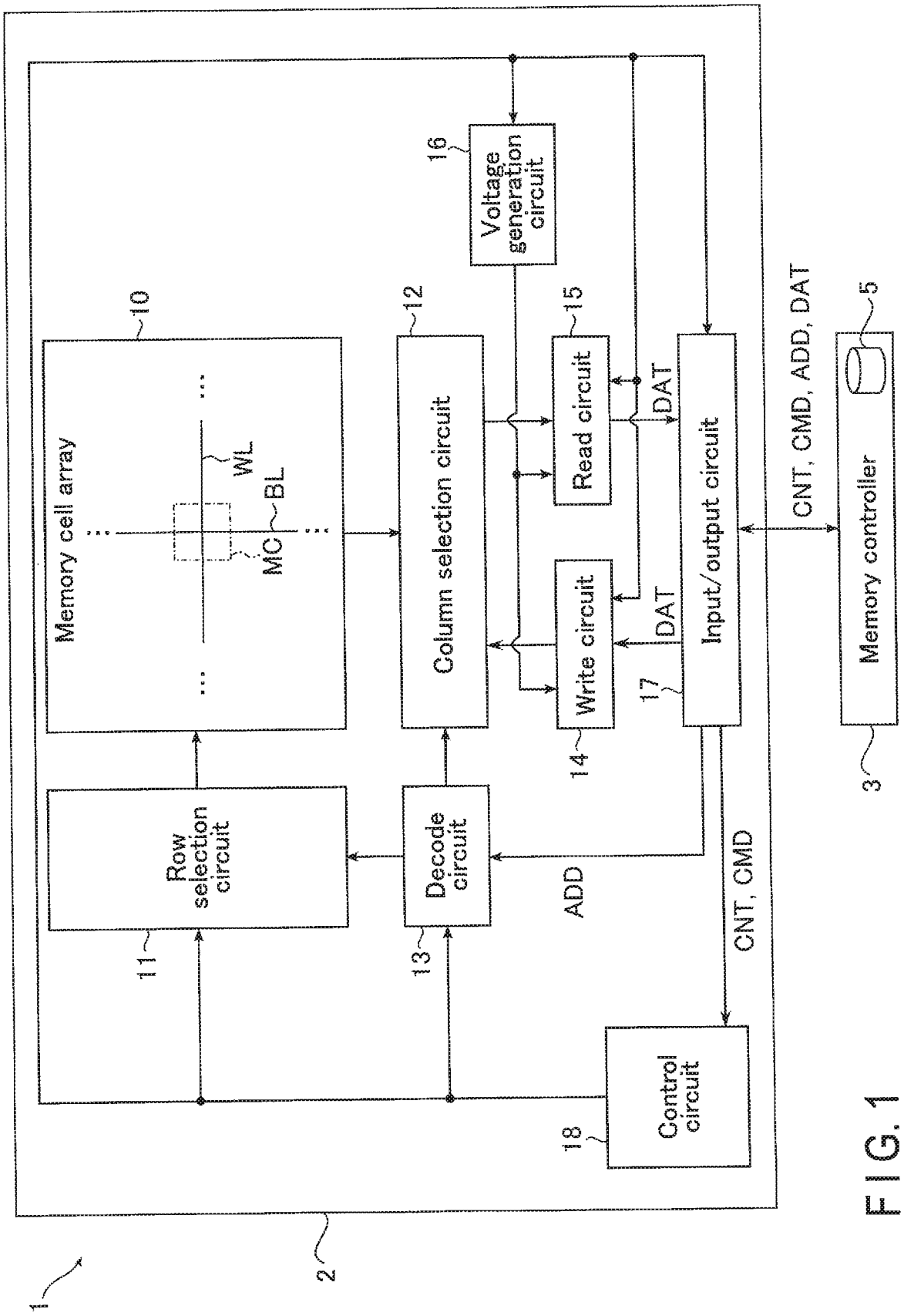
F I G. 1

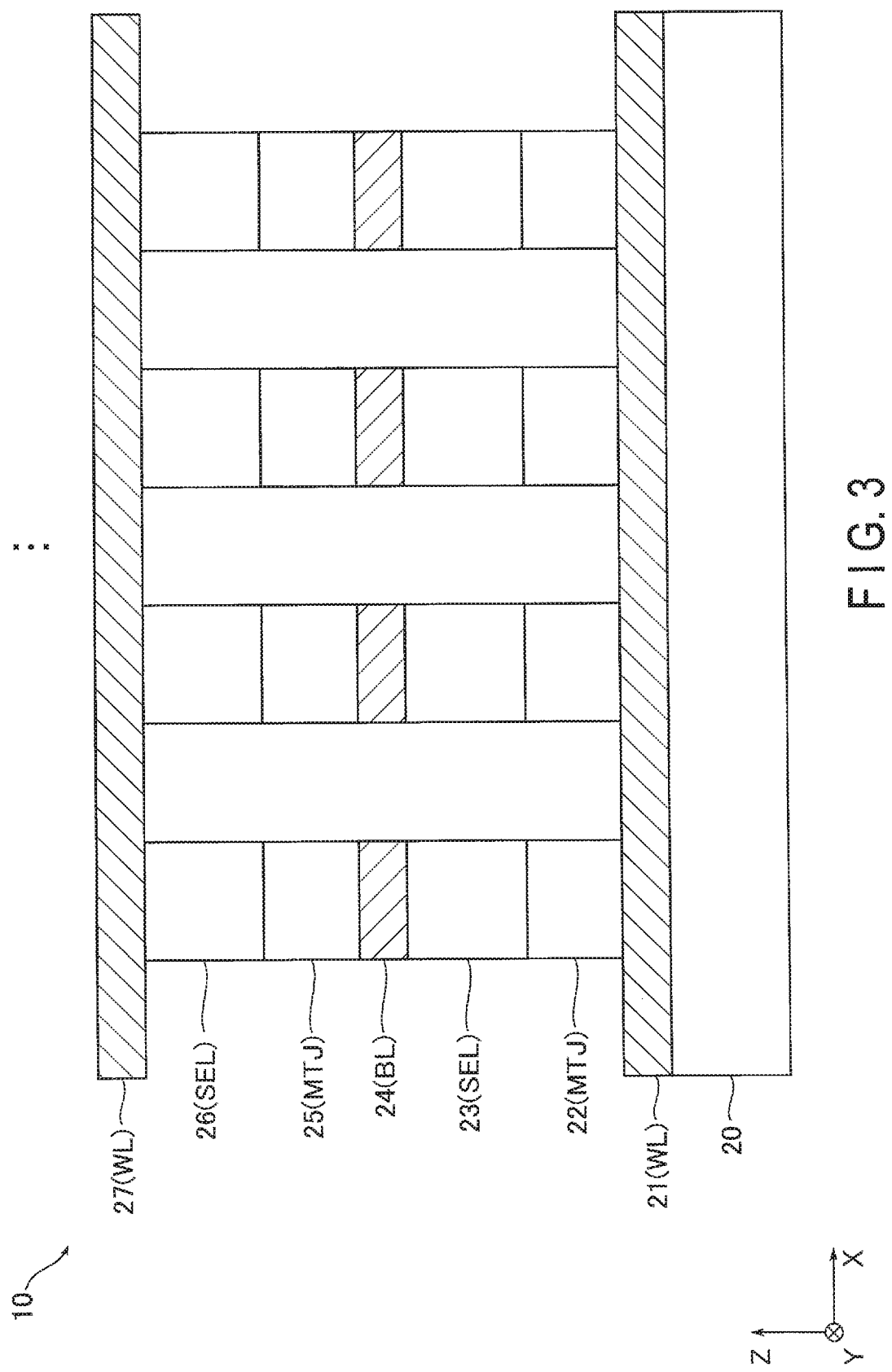
F I G. 3

5

| Address information on defective memory cell | Address information on word line WL connected to defective memory cell | Address information on bit line BL connected to defective memory cell |
|---|---|---|
| <3,5,7> | <4,5> | <3,7> |
| <6,8,9> | <6,8> | <7,9> |
| ⋮ | ⋮ | ⋮ |

FIG. 6

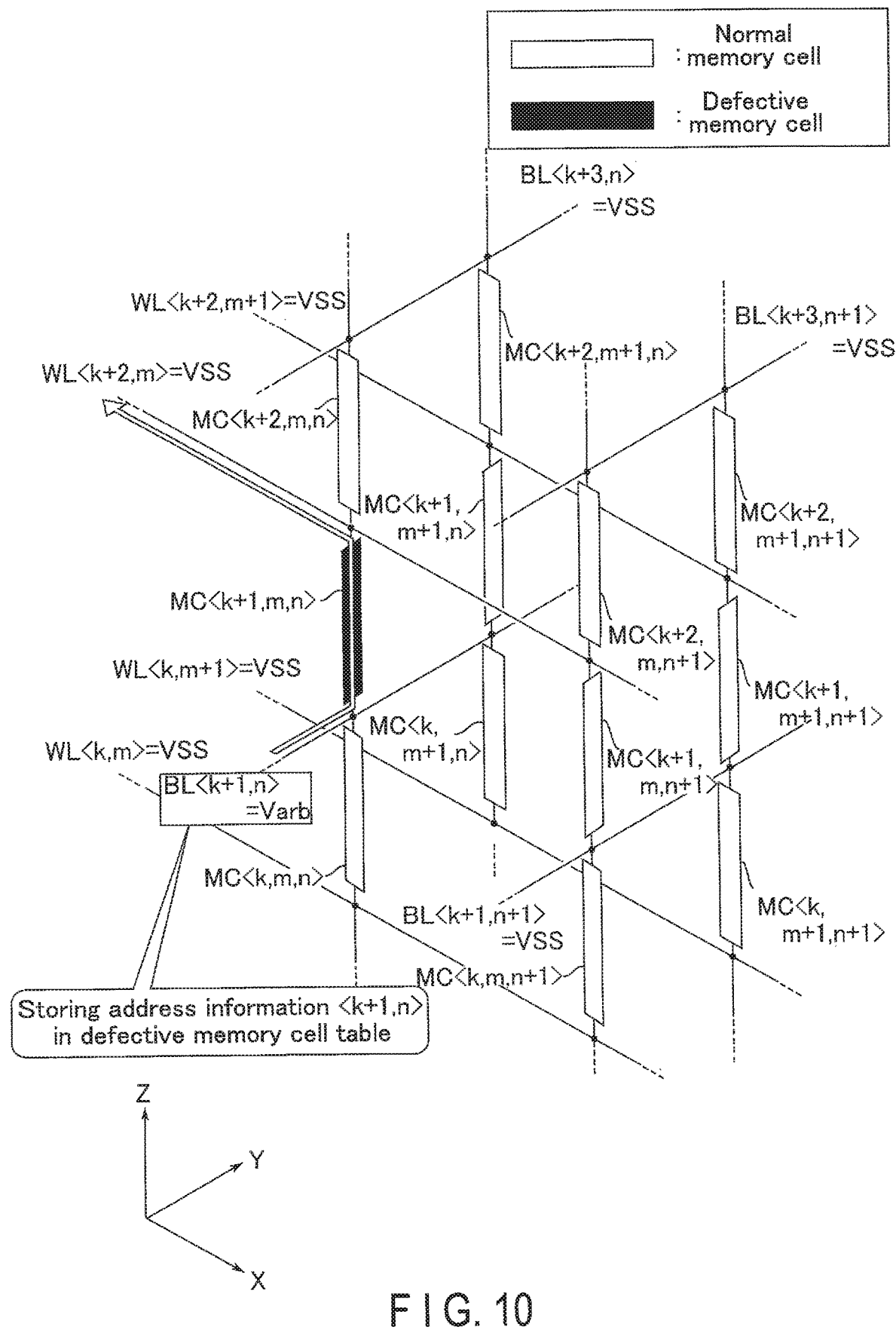
F I G. 10

SEMICONDUCTOR MEMORY DEVICE AND MEMORY SYSTEM

CROSS-REFERENCE TO RELATED APPLICATIONS

This application is based upon and claims the benefit of priority from Japanese Patent Application No. 2020-042786, filed Mar. 12, 2020, the entire contents of which are incorporated herein by reference.

FIELD

Embodiments described herein relate generally to a semiconductor memory device and a memory system.

BACKGROUND

A memory system including a semiconductor memory device and a memory controller has been known. The semiconductor memory device uses resistance change elements as storage elements. The memory controller controls the semiconductor memory device. A known example of the semiconductor memory device is, e.g., a magnetoresistive random access memory (MRAM) using magnetoresistance effect elements as resistance change elements.

BRIEF DESCRIPTION OF THE DRAWINGS

FIG. 1 is a block diagram illustrating a configuration of a memory system including a semiconductor memory device according to one embodiment.

FIG. 3 is a cross-sectional view illustrating the configuration of a memory cell array of the semiconductor memory device according to the embodiment.

FIG. 6 is a conceptual diagram illustrating a defective memory cell table stored in the memory system including the semiconductor memory device according to the embodiment.

FIG. 10 is a schematic diagram illustrating a scan operation in the semiconductor memory device according to the embodiment.

DETAILED DESCRIPTION

Figure 2:
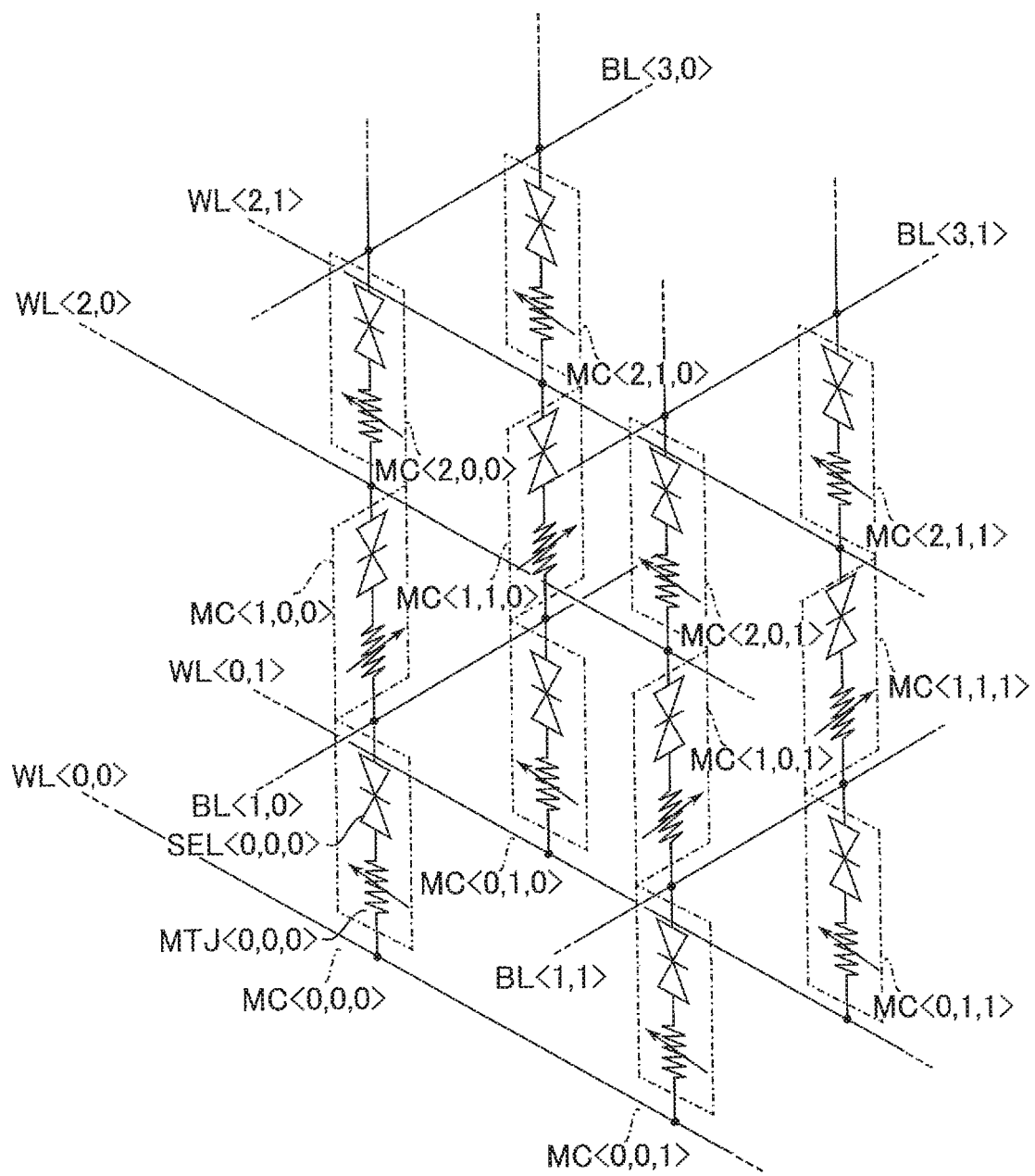
FIG. 2 is a circuit diagram illustrating a configuration of a memory cell array of the semiconductor memory device according to the embodiment.

In general, according to one embodiment, a semiconductor memory device includes: a first memory cell and a first switching element coupled in series between a first interconnect and a second interconnect; a second memory cell and a second switching element coupled in series between the first interconnect and a third interconnect; a third memory cell and a third switching element coupled in series between the first interconnect and a fourth interconnect; and a control circuit. The control circuit is configured to: in a first operation on the first memory cell, the first operation including applying a first voltage to the first interconnect and applying a second voltage to the second interconnect, upon receipt of a first command, apply a third voltage between the first voltage and the second voltage to the third interconnect and the fourth interconnect; and upon receipt of a second command, apply the first voltage to the fourth interconnect, while applying the third voltage to the third interconnect.

Hereinafter, embodiments will be described with reference to the accompanying drawings. In the following description, constituent elements having the same function and configuration will be assigned common reference numerals. If it is necessary to distinguish structural elements having the same reference symbols from each other, an additional symbol is added after the reference symbol. If it is unnecessary to distinguish the structural elements, only a common reference symbol is assigned to the structural elements, and no additional symbol is added. Herein, additional symbols are not limited to subscripts or superscripts, and they may be lower-case alphabetical letters added to references symbols, and indices that mean an array.

1. Embodiment

A semiconductor memory device according to one embodiment will be described. Examples of the semiconductor memory device according to the embodiment include a magnetic memory device based on perpendicular magnetic technology, which uses, as variable resistance elements, elements that exhibit a magnetoresistive effect through magnetic tunnel junctions (MTJs) (referred to as "MTJ elements" or "magnetoresistance effect elements").

In the following description, the aforementioned magnetic memory device will be described as an example of the semiconductor memory device, and the aforementioned magnetic tunnel junction element will be described as an example of the magnetoresistance effect element.

1.1 Configuration

First, a configuration of the semiconductor memory device according to the embodiment will be described.

1.1.1 Memory System

FIG. 1 is a block diagram showing a configuration of a memory system including a semiconductor memory device according to the embodiment.

As shown in FIG. 1, a memory system 1 includes a semiconductor memory device 2 and a memory controller 3. The semiconductor memory device 2 contains a plurality of memory cells MC each configured to store data in a nonvolatile manner. The memory controller 3 controls the semiconductor memory device 2. The memory system 1 is connected to a host device (not shown) such as a processor, etc.

The memory controller 3 transmits control signals CNT through communication with the semiconductor memory device 2, and commands the semiconductor memory device 2 to perform access operations (for example, data write operation, data read operation, etc.) with respect to each memory cell MC within the semiconductor memory device 2. When these operations are executed, the memory controller 3 issues each command CMD corresponding to each operation, and sends to the semiconductor memory device 2 a command CMD and address ADD of a target for a corresponding operation. The address ADD is information with which one of the memory cells MC can be specified. For example, the address ADD includes a layer address, a row address, and a column address.

For example, in the execution of a write operation, the memory controller 3 sends to the semiconductor memory device 2 data to be written ("write data") DAT along with a command CMD for commanding the write operation and an address ADD of a write target. In the execution of a read operation, the memory controller 3 sends to the semiconductor memory device 2 a command CMD for commanding the read operation and an address ADD of a read target, and receives data read out ("read data") DAT from the semiconductor memory device 2.

The memory controller 3 stores a defective memory cell table 5 in, for example, an internal RAM (not shown). The defective memory cell table 5 includes information for specifying a memory cell MC determined to be defective from among a plurality of memory cells MC within the semiconductor memory device 2. The defective memory cell table 5 will be described in detail later.

The semiconductor memory device 2 includes a memory cell array 10, a row selection circuit 11, a column selection circuit 12, a decode circuit 13, a write circuit 14, a read circuit 15, a voltage generation circuit 16, an input/output circuit 17, and a control circuit 18.

The memory cell array 10 includes a plurality of memory cells MC each associated with a pair of a row and a column. Specifically, memory cells MC arranged in the same row are coupled to the same word line WL, and memory cells MC arranged in the same column are coupled to the same bit line BL.

The row selection circuit 11 is coupled to the memory cell array 10 by way of word lines WL. The row selection circuit 11 receives a decoding result of an address ADD (i.e., a layer address and a row address) supplied from the decode circuit 13. The row selection circuit 11 sets to a selected state a word line WL corresponding to a layer and a row which are determined based on the decoding result of the address ADD. Hereinafter, a word line WL set to a selected state will be referred to as a selected word line WL. Word lines WL other than the selected word line WL will be referred to as non-selected word lines WL.

The column selection circuit 12 is coupled to the memory cell array 10 by way of bit lines BL. The column selection circuit 12 receives a decoding result of an address ADD (i.e., a layer address and a column address) supplied from the decode circuit 13. The column selection circuit 12 sets to a selected state a bit line BL corresponding to a layer and a column which are determined based on the decoding result of the address ADD. Hereinafter, a bit line BL set to a selected state will be referred to as a selected bit line BL. Bit lines BL other than the selected bit line BL will be referred to as non-selected bit lines BL.

The decode circuit 13 decodes an address ADD from the input/output circuit 17. The decode circuit 13 supplies a decoding result of the address ADD to the row selection circuit 11 and the column selection circuit 12. The address ADD includes addresses of a column and a row that are to be selected.

The write circuit 14 writes data to each memory cell MC. The write circuit 14 includes, for example, a write driver (not shown).

The read circuit 15 reads data from each memory cell MC. The read circuit 15 includes, for example, a sense amplifier (not shown).

The voltage generation circuit 16 generates voltages for various operations of the memory cell array 10, using a power supply voltage provided from outside (not shown) of the semiconductor memory device 2. For example, the voltage generation circuit 16 generates various voltages required for a write operation, and outputs them to the write circuit 14.

For example, the voltage generation circuit 16 generates various voltages required for a read operation, and outputs them to the read circuit 15.

The input/output circuit 17 transfers an address ADD received from outside of the semiconductor memory device 2 to the decode circuit 13. The input/output circuit 17 transfers a command CMD received from outside of the semiconductor memory device 2 to the control circuit 18. The input/output circuit 17 allows the transmission and reception of control signals CNT between the outside of the semiconductor memory device 2 and the control circuit 18. The input/output circuit 17 transfers data DAT received from outside of the semiconductor memory device 2 to the write circuit 14, and outputs data DAT transferred from the read circuit 15 to the outside of the semiconductor memory device 2.

The control circuit 18 controls, based on control signals CNT and commands CMD, the operations of the row selection circuit 11, the column selection circuit 12, the decode circuit 13, the write circuit 14, the read circuit 15, the voltage generation circuit 16, and the input/output circuit 17 that are contained in the semiconductor memory device 2.

1.1.2 Configuration of Memory Cell Array

Next, a configuration of a memory cell in the semiconductor memory device according to the embodiment will be described with reference to FIG. 2. FIG. 2 is a circuit diagram showing a configuration of a memory cell array of the semiconductor memory device according to the embodiment.

In the description below, each word line WL is uniquely identified with a row address m and an even-numbered layer address k, and is expressed as "WL<k,m>" using index < >. Each bit line BL is uniquely identified with a column address n and an odd-numbered layer address k, and is expressed as "BL<k,n>" using index < >. Each memory cell MC is uniquely identified with a layer address k, a row address m, and a column address n, and is expressed as "MC<k,m,n>". Herein, k, m, and n are integers respectively defined as $0 \le k \le K$, $0 \le m \le M$, and $0 \le n \le N$ (K, M, and N are natural numbers).

As shown in FIG. 2, the memory cells MC are arranged in a matrix pattern in the memory cell array 10. Each of the memory cells MC is associated with a set including one of the bit lines BL (BL<1,0>, BL<1,1>, . . . , BL<3,0>, BL<3,1>, . . . ) and one of the word lines WL (WL<0,0>, WL<0,1>, . . . , WL<2,0>, WL<2,1>, . . . ), and is uniquely identified by a set including a layer address k, a row address m, and a column address n. Specifically, in the case of an even-numbered layer address k, the memory cell MC<k,m,n> is coupled between the word line WL<k,m> and the bit line BL<k+1,n>. In the case of an odd-numbered layer address k, the memory cell MC<k,m,n> is coupled between the word line WL<k+1,m> and the bit line BL<k,n>.

The memory cell MC<k,m,n> includes a switching element SEL<k,m,n> and a magnetic tunnel junction element MTJ<k,m,n> coupled in series.

When data is written to and read from a magnetic tunnel junction element MTJ, a corresponding switching element SEL functions as a switch that controls supply of a current to the magnetic tunnel junction element MTJ. Specifically, a switching element SEL in a memory cell MC, for example, serves as an insulator having a large resistance value and interrupts a current (in other words, enters an OFF state) when a voltage applied to this switching element SEL is below a threshold voltage Vth, and serves as a conductor having a small resistance value and allows a current to flow therethrough (in other words, enters an ON state) when the voltage exceeds the threshold voltage Vth. That is, a switching element SEL has a function of switching between a state of allowing a current to flow and a state of interrupting a current, in accordance with the magnitude of a voltage applied to the switching element SEL, regardless of the direction of the current flow.

A switching element SEL may be, for example, a two-terminal switching element. When a voltage applied between two terminals is smaller than a threshold voltage, a corresponding switching element is in a "high-resistance" state, e.g., in an electrically non-conductive state. When a voltage applied between two terminals is equal to or greater than the threshold value, a corresponding switching element transitions to a "low-resistance" state, e.g., to an electrically conductive state. A switching element may have this function regardless of the polarity of voltage.

With a current supply controlled by a switching element SEL, a resistance value of a corresponding magnetic tunnel junction element MTJ can be switched between a low-resistance state and a high-resistance state. A magnetic tunnel junction element MTJ functions as a memory element that allows data to be written therein according to a change in its resistance state, retains the written data in a non-volatile manner, and allows the retained data to be read therefrom.

However, if a switching element SEL is short-circuited due to some kind of defect, it is no longer possible for the switching element SEL to control a current flowing through a corresponding magnetic tunnel junction element MTJ, in accordance with a voltage being applied. In this case, a memory cell MC containing this short-circuited switching element SEL may have an unintentional current flow, which is not preferable. In the description below, a memory cell MC containing a short-circuited switching element SEL will be referred to as a "defective memory cell MC" or "fail bit", and will be distinguished from memory cells MC functioning normally.

Figure 4:
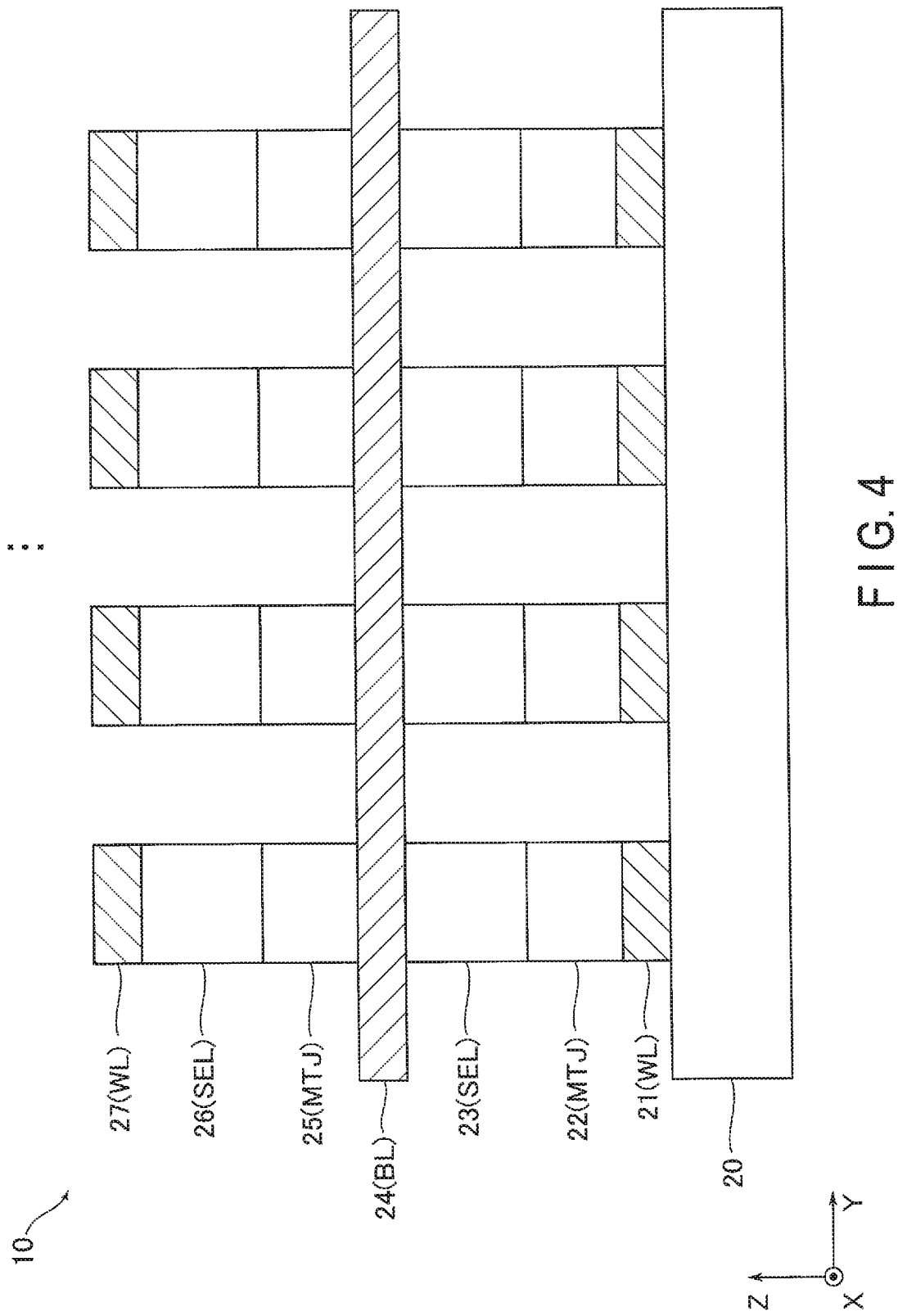
FIG. 4 is a cross-sectional view illustrating the configuration of a memory cell array of the semiconductor memory device according to the embodiment.

Next, a cross-sectional configuration of the memory cell array 10 will be described with reference to FIGS. 3 and 4. FIGS. 3 and 4 are each an example of a cross-sectional view for illustrating a configuration of a memory cell array of the semiconductor memory device according to the embodiment. In FIGS. 3 and 4, interlayer insulation films are omitted for convenience of description.

In the following description, a plane parallel to a surface of a semiconductor substrate 20 will be referred to as an "XY plane", and an axis perpendicular to the XY plane will be referred to as a "Z axis". The direction approaching the semiconductor substrate 20 along the Z axis is assumed as a "lower" side, and the direction moving away from the semiconductor substrate 20 is assumed as an "upper" side. Within the XY plane, two axes perpendicular to each other form a pair, and one of these axes will be referred to as an "X axis" and the other will be referred to as a "Y axis".

As shown in FIGS. 3 and 4, the memory cell array 10 is provided on the upper side of the semiconductor substrate 20.

The semiconductor substrate 20 has its upper surface provided with, for example, a plurality of conductors 21. The respective conductors 21 have conductivity and function as the word lines WL. An insulator 41 is provided in each region between two adjacent conductors 21. With this, the conductors 21 are insulated from each other. FIGS. 3 and 4 illustrate the case in which the plurality of conductors 21 are provided on the semiconductor substrate 20; however, the configuration is not limited to this. For example, the conductors 21 may be provided above the semiconductor substrate 20 without being in contact with the semiconductor substrate 20.

Each one of the conductors 21 has the upper surface provided with a plurality of elements 22 which respectively function as the magnetic tunnel junction elements MTJ. The elements 22 provided on the upper surface of one conductor 21 are aligned along the X axis. That is, the elements 22 aligned along the X axis are commonly coupled to the upper surface of one conductor 21. The configuration of the elements 22 will be described later in detail.

Each of the elements 22 has the upper surface provided with an element 23 which functions as a switching element SEL. Each of the elements 23 has the upper surface coupled to any one of the conductors 24.

The conductors 24 have conductivity and function as the bit lines BL. The plurality of elements 23 aligned along the Y axis are commonly coupled to one conductor 24. FIGS. 3 and 4 illustrate the case in which each of the elements 23 is provided in contact with the corresponding element 22 and the corresponding conductor 24; however, the configuration is not limited to this. For example, each of the elements 23 may be coupled to a corresponding element 22 and a corresponding conductor 24 with a conductive contact plug (not shown) interposed therebetween.

With the configuration described above, in the memory cell array 10, a single memory cell MC is provided between a single word line WL and a single bit line BL.

1.1.3 Magnetic Tunnel Junction Element

Figure 5:
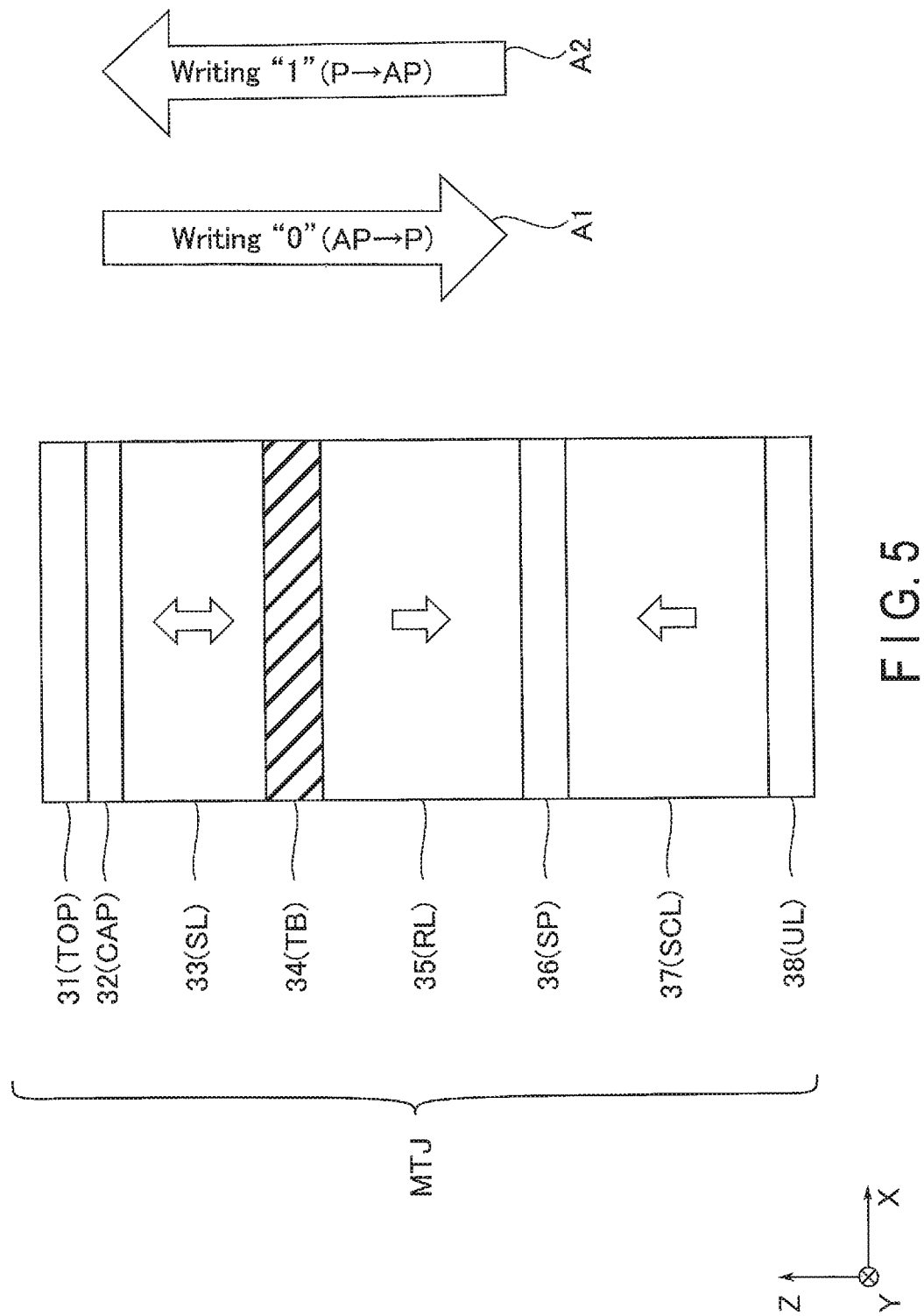
FIG. 5 is a cross-sectional view illustrating a configuration of a magnetoresistance effect element of the semiconductor memory device according to the embodiment.

Next, a configuration of a magnetic tunnel junction element of a semiconductor memory device according to the embodiment will be described with reference to FIG. 5. FIG. 5 is a cross-sectional view showing a configuration of a magnetic tunnel junction element of a semiconductor memory according to the embodiment. FIG. 5 shows an exemplary cross section of the magnetic tunnel junction element MTJ shown in, for example, FIGS. 3 and 4, cut along a plane perpendicular to the Z axis (e.g., the XZ plane).

As shown in FIG. 5, the magnetic tunnel junction element MTJ includes, for example, a nonmagnet 31 which functions as a top layer TOP, a nonmagnet 32 which functions as a capping layer CAP, a ferromagnet 33 which functions as a storage layer SL, a nonmagnet 34 which functions as a tunnel barrier layer TB, a ferromagnet 35 which functions as a reference layer RL, a nonmagnet 36 which functions as a spacer layer SP, a ferromagnet 37 which functions as a shift canceling layer SCL (shift cancelling layer), and a nonmagnet 38 which functions as an under layer UL.

In the magnetic tunnel junction element MTJ, the nonmagnet 38, the ferromagnet 37, the nonmagnet 36, the ferromagnet 35, the nonmagnet 34, the ferromagnet 33, the nonmagnet 32, and the nonmagnet 31 are stacked in the order from the side of the word line WL toward the side of the bit line BL (in the z-axis direction). The magnetic tunnel junction element MTJ functions as, for example, a perpendicular-magnetization type MTJ element in which the magnetization direction of a magnet constituting the magnetic tunnel junction element MTJ is perpendicular to the film surface. The magnetic tunnel junction element MTJ may further include unillustrated layers between the layers 31-38.

The nonmagnet 31 is a nonmagnetic conductor, and functions as a top electrode that enhances electrical connectivity between the upper end of the magnetic tunnel junction element MTJ and the bit line BL or the word line WL. The nonmagnet 31 includes at least one element selected from the group consisting of, for example, tungsten (W), tantalum (Ta), tantalum nitride (TaN), titanium (Ti), and titanium nitride (TiN), or a compound.

The nonmagnet 32 is non-magnetic and has a function of preventing the damping coefficient of the ferromagnet 33 from increasing, and reducing a write current. The nonmagnet 32 includes at least one nitride or oxide selected from the group consisting of, for example, magnesium oxide (MgO), magnesium nitride (MgN), zirconium nitride (ZrN), niobium nitride (NbN), silicon nitride (SiN), aluminum nitride (AlN), hafnium nitride (HfN), tantalum nitride (TaN), tungsten nitride (WN), chromium nitride (CrN), molybdenum nitride (MoN), titanium nitride (TiN), and vanadium nitride (VN). The nonmagnet 32 may be a mixture of these nitrides and oxides. Specifically, the nonmagnet 32 is not limited to a binary compound consisting of two different elements, and may be a ternary compound consisting of three different elements, such as titanium aluminum nitride (AlTiN), etc.

The ferromagnet 33 has ferromagnetic properties, and has a magnetization easy axis in a direction perpendicular to a film plane. The ferromagnet 33 has a magnetization direction toward either the bit line BL side or the word line WL side along the Z axis. The ferromagnet 33 contains at least one of iron (Fe), cobalt (Co), and nickel (Ni), and the ferromagnet 33 further contains boron (B). More specifically, the ferromagnet 33 may contain, for example, iron cobalt boron (FeCoB) or iron boron (FeB), and have a body-centered crystal structure.

The nonmagnet 34 is a nonmagnetic insulator containing, for example, magnesium oxide (MgO), and may further contain boron (B), as described above. The nonmagnet 34 has an NaCl crystal structure with its film plane oriented in a (001) plane, and functions as a seed material to be a nucleus for growth of a crystalline film from an interface with the ferromagnet 33 during a crystallization process of the ferromagnet 33. The nonmagnet 34 is provided between the ferromagnet 33 and the ferromagnet 35, and forms, together with these two ferromagnets, a magnetic tunnel junction.

The ferromagnet 35 has ferromagnetic properties, and has a magnetization easy axis in a direction perpendicular to the film plane. The ferromagnet 35 has a magnetization direction toward either the bit line BL side or the word line WL side along the Z axis. The ferromagnet 35 contains, for example, at least one of iron (Fe), cobalt (Co), and nickel (Ni). The ferromagnet 35 may further contain boron (B). More specifically, the ferromagnet 35 may contain, for example, iron cobalt boron (FeCoB) or iron boron (FeB), and have a body-centered crystal structure. The magnetization direction of the ferromagnet 35 is fixed, and is toward the direction of the ferromagnet 37 in the example of FIG. 5. The "magnetization direction" being "fixed" means that the magnetization direction is not varied by a current (spin torque) of a magnitude that could invert the magnetization direction of the ferromagnet 33.

The ferromagnet 35 may be a layer stack including a plurality of layers, although this is not illustrated in FIG. 5. Specifically, a layer stack that constitutes the ferromagnet 35 may have, for example, a structure including a layer containing the aforementioned iron cobalt boron (FeCoB) or iron boron (FeB) as an interface layer with the nonmagnet 34, and including an additional ferromagnet stacked between the interface layer and the nonmagnet 36 with a nonmagnetic conductor interposed therebetween. The nonmagnetic conductor in the layer stack that constitutes the ferromagnet 35 may contain at least one metal selected from the group consisting of, for example, tantalum (Ta), hafnium (Hf), tungsten (W), zirconium (Zr), molybdenum (Mo), niobium (Nb), and titanium (Ti). The additional ferromagnet in the layer stack that constitutes the ferromagnet 35 may contain at least one multilayer film selected from the group consisting of, for example, a multilayer film of cobalt (Co) and platinum (Pt) (Co/Pt multilayer film), a multilayer film of cobalt (Co) and nickel (Ni) (Co/Ni multilayer film), and a multilayer film of cobalt (Co) and palladium (Pd) (Co/Pd multilayer film).

The nonmagnet 36 is a non-magnetic conductor, and contains at least one element selected from the group consisting of, for example, ruthenium (Ru), osmium (Os), iridium (Ir), vanadium (V), and chromium (Cr).

The ferromagnet 37 has ferromagnetic properties, and has a magnetization easy axis in a direction perpendicular to the film plane. The ferromagnet 37 has a magnetization direction toward either the bit line BL side or the word line WL side along the Z axis. The magnetization direction of the ferromagnet 37 is fixed, similarly to the ferromagnet 35, and is toward the direction of the ferromagnet 35 in the example of FIG. 5. The ferromagnet 37 contains at least one alloy selected from the group consisting of, for example, cobalt platinum (CoPt), cobalt nickel (CoNi), and cobalt palladium (CoPd). The ferromagnet 37 may be a layer stack including a plurality of layers, similarly to the ferromagnet 35. In this case, the ferromagnet 37 may contain at least one multilayer film selected from the group consisting of, for example, a multilayer film of cobalt (Co) and platinum (Pt) (Co/Pt multilayer film), a multilayer film of cobalt (Co) and nickel (Ni) (Co/Ni multilayer film), and a multilayer film of cobalt (Co) and palladium (Pd) (Co/Pd multilayer film).

The ferromagnets 35 and 37 are antiferromagnetically coupled by the nonmagnet 36. That is, the ferromagnets 35 and 37 are coupled in such a manner that their magnetization directions are anti-parallel to each other. Accordingly, the magnetization directions of the ferromagnets 35 and 37 are opposite to each other in the example of FIG. 5. Such a coupling structure of the ferromagnet 35, the nonmagnet 36, and the ferromagnet 37 is referred to as a synthetic antiferromagnetic (SAF) structure. This allows the ferromagnet 37 to cancel the influence of a leak field of the ferromagnet 35 on the magnetization direction of the ferromagnet 33. This prevents asymmetry from occurring in the ease of rotation of the magnetization direction of the ferromagnet 33, due to, e.g., a leak field of the ferromagnet 35 (that is, prevents the ease of reversal of the magnetization direction of the ferromagnet 33 from differing between the case of reversing from one side to the other and the case of reversing in the opposite direction).

The nonmagnet 38 is a nonmagnetic conductor, and has a function as an electrode for improving electrical connectivity between the bit line BL and the word line WL. The nonmagnet 38 contains, for example, a high-melting-point metal. The high-melting-point metal is a material having a melting point higher than that of iron (Fe) and cobalt (Co), and includes at least one element selected from, for example, zirconium (Zr), hafnium (Hf), tungsten (W), chromium (Cr), molybdenum (Mo), niobium (Nb), titanium (Ti), tantalum (Ta), vanadium (V), ruthenium (Ru), and platinum (Pt).

The embodiment adopts a spin injection write technique, in which a write current is allowed to directly flow through the magnetic tunnel junction element MTJ, and a spin torque is injected into the storage layer SL and the reference layer RL by the write current, thereby controlling the magnetization directions of the storage layer SL and the reference layer RL. The magnetic tunnel junction element MTJ may take either a low-resistance state or a high-resistance state, depending on whether the relative relationship between the magnetization directions of the storage layer SL and the reference layer RL is parallel or anti-parallel.

When write current Ic0 of a certain magnitude is allowed to flow through the magnetic tunnel junction element MTJ in the direction of the arrow A1 in FIG. 5, namely, the direction from the storage layer SL toward the reference layer RL, the relative relationship between the magnetization directions of the storage layer SL and the reference layer RL becomes parallel. In this parallel state, resistance of the magnetic tunnel junction element MTJ takes the minimum value, and the magnetic tunnel junction element MTJ is set to a low-resistance state. This low-resistance state is called a "P (parallel) state", and is defined as a state of data "0".

When write current Ic1 greater than the write current Ic0 is allowed to flow through the magnetic tunnel junction element MTJ in the direction of the arrow A2 in FIG. 5, namely, the direction from the reference layer RL toward the storage layer SL (opposite to the arrow A1), the relative relationship between the magnetization directions of the storage layer SL and the reference layer RL becomes anti-parallel. In this anti-parallel state, resistance of the magnetic tunnel junction element MTJ takes the maximum value, and the magnetic tunnel junction element MTJ is set to a high-resistance state. This high-resistance state is called an "anti-parallel (AP) state", and is defined as, for example, the state of data "1".

The following description will be given pursuant to the above-described data-defining method; however, how data "1" and data "0" are defined is not limited to the above-described example. For example, the P state may be defined as data "1", and the AP state may be defined as data "0".

1.1.4 Defective Memory Cell Table

Next, a defective memory cell table stored in the memory system including the semiconductor memory device according to the embodiment will be described with reference to a conceptual diagram shown in FIG. 6.

As shown in FIG. 6, the defective memory cell table 5 stores address information on a defective memory cell MC and address information on a word line WL and a bit line BL both connected to the defective memory cell MC in such a manner that the address information on the defective memory cell MC and the address information on the bit line WL and the bit line BL are correlated with each other.

Specifically, in the example shown in FIG. 6, address information <3,5,7> on a memory cell MC<3,5,7> and address information <6,8,9> on a memory cell MC<6,8,9> are stored as address information on a defective memory cell MC.

With the memory cell MC<3,5,7> being sandwiched between a word line WL<4,5> and a bit line BL<3,7>, address information <4,5> on the word line WL<4,5> and address information <3,7> on the bit line BL<3,7> are each stored. With the memory cell MC<6,8,9> being sandwiched between a word line WL<6,8> and a bit line BL<7,9>, address information <6,8> on the word line WL<6,8> and address information <7,9> on the bit line BL<7,9> are each stored as address information on a word line WL and a bit line BL both connected to a defective memory cell MC.

There is a one-to-one correspondence between address information on a defective memory cell MC and address information on a pair of a word line WL and a bit line BL connected to the defective memory cell MC. Therefore, the defective memory cell table 5 may be required to store at least one of address information on a defective memory cell MC and address information on a pair of a word line WL and a bit line BL.

In the case described above, the defective memory cell table 5 is stored in the memory controller 3. However, this is not a limitation. For example, the defective memory cell table 5 may be stored in a nonvolatile manner in the memory cell array 10 within the semiconductor memory device 2.

1.2 Operations

Next, the operations of the semiconductor memory device according to the embodiment will be described.

1.2.1 Series of Operations Until Memory Cell is Accessed

A series of operations that are taken until a memory cell MC is accessed in the semiconductor memory device 2 will be described with reference to a flowchart shown in FIG. 7.

Figure 7:
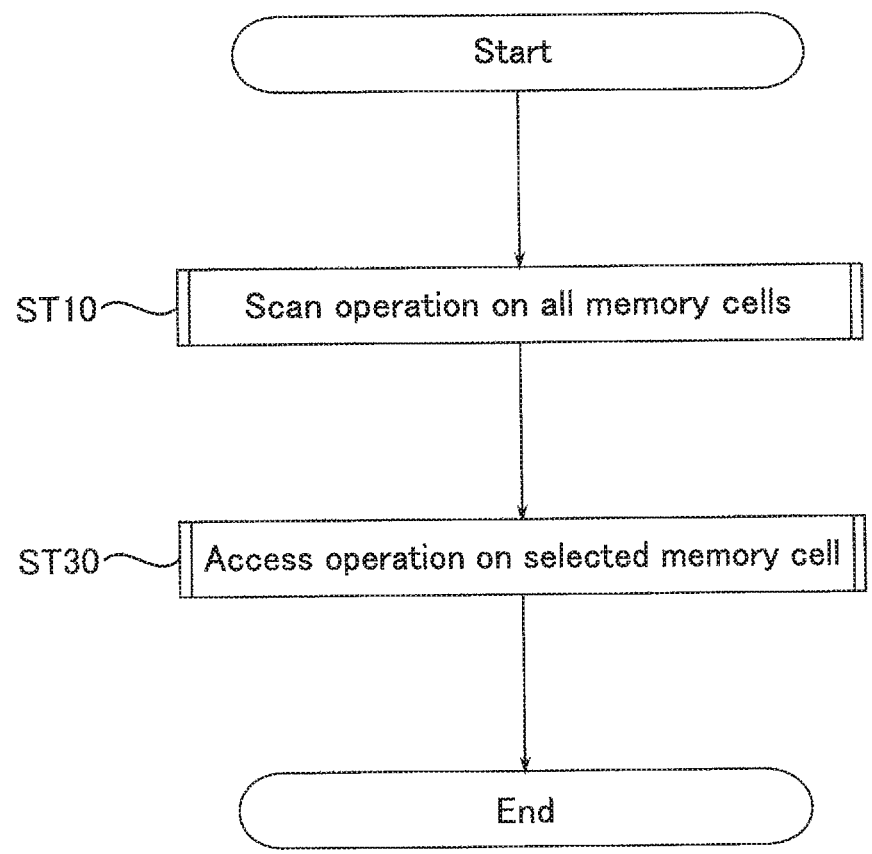
FIG. 7 is a flowchart illustrating a series of operations that are taken until a memory cell is accessed in the semiconductor memory device according to the embodiment.

As shown in FIG. 7, in step ST10, the semiconductor memory device 2 performs a scan operation with respect to all of the memory cells MC within the memory cell array 10. Upon receipt of a command (scan command) indicating execution of a scan operation from, e.g., the memory controller 3, the semiconductor memory device 2 initiates the scan operation. As a result of the scan operation, the memory controller 3 can cause the defective memory cell table 5 to store an address of a defective memory cell MC within the memory cell array 10

An execution timing of a scan operation is not limited, provided that the scan operation is executed before an access operation to be described later. For example, the memory controller 3 may periodically execute the scan operation or may execute the scan operation when the semiconductor memory device 2 (or the memory system 1) is started up.

The scan operation may be executed during manufacturing of the semiconductor memory device 2 (for example, before shipment of the semiconductor memory device 2 and after completion of a chip burn-in test with respect to the semiconductor memory device 2). If a scan operation is executed during manufacturing of the semiconductor memory device 2, a scan command may be issued by, e.g., a tester (not shown). A result of the scan operation may be stored in the semiconductor memory device 2, and be further stored in the defective memory cell table 5 within the memory controller 3 after the semiconductor memory device 2 and the memory controller 3 are connected to each other.

In any case, the memory controller 3 may execute an access operation to be described later, based on the defective memory cell table 5 which reflects a result of the scan operation.

In step ST30, the semiconductor memory device 2 executes an access operation with respect to a selected memory cell MC. Upon receipt of an access command indicating execution of an access operation (such as a write command, a read command, etc.) from the memory controller 3, the semiconductor memory device 2 initiates the access operation (such as a write operation, a read operation, etc.). The access command contains, e.g., address information on a selected memory cell MC.

Upon receipt of a read command, the semiconductor memory device 2 reads data from the selected memory cell MC within the memory cell array 10, and outputs the read data to the memory controller 3. Upon receipt of a write command, the semiconductor memory device 2 writes in the selected memory cell MC write data received along with the write command from the memory controller 3.

When issuing an access command, the memory controller 3 considers information within the defective memory cell table 5. For example, if neither address information on a selected word line WL nor address information on a selected bit line BL is stored in the defective memory cell table 5, the memory controller 3 may issue a normal access command (first access command). If one of address information on a selected word line WL and address information on a selected bit line BL is stored in the defective memory cell table 5, the memory controller 3 may issue an access command (second access command) different from the normal access command. Upon receipt of the second access command, the semiconductor memory device 2 may apply to a non-selected word line WL and a non-selected bit line BL, a voltage different from that to be applied upon receipt of the first access command. Details of the access operation will be described later.

This is the end of the series of operations that are taken until a memory cell MC is accessed within the semiconductor memory device 2.

1.2.2 Scan Operation

Next, details of a scan operation will be described.

Figure 8:
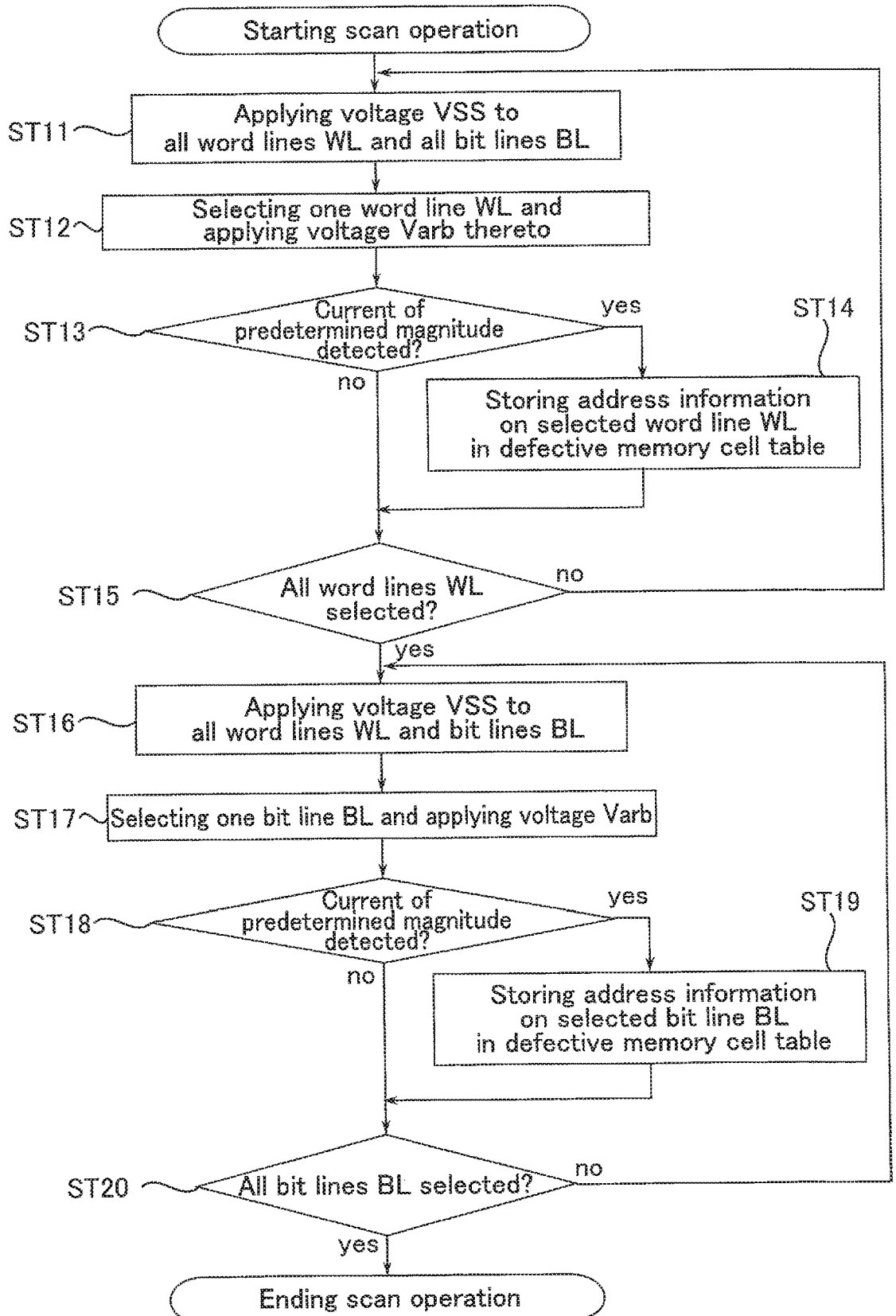
FIG. 8 is a flowchart illustrating a scan operation in the semiconductor memory device according to the embodiment.

FIG. 8 is a flowchart illustrating a scan operation in the semiconductor memory device according to the embodiment. FIG. 8 shows an operation in the semiconductor memory device 2 based on the scan command, and an accompanying operation of the memory controller 3.

As shown in FIG. 8, in step ST11, the row selection circuit 11 and the column selection circuit 12 apply voltage VSS to all of the word lines WL and the bit lines BL. Voltage VSS is a ground voltage and represents, for example, 0 V. The following description will assume that voltage VSS is equal to 0 V.

In step ST12, the row selection circuit 11 selects one of the word lines WL and applies voltage Varb to this selected word line WL. Voltage Varb is greater than voltage VSS and smaller than threshold voltage Vth of the switching element SEL.

In step ST13, the control circuit 18 determines whether or not a current of a predetermined magnitude has flowed through a selected word line WL in a state set in steps ST11 and ST12. If a current of a predetermined magnitude is detected (step ST13; Yes), the processing proceeds to step ST14. If a current of a predetermined magnitude is not detected (step ST13; No), the processing proceeds to step ST15.

In step ST14, the control circuit 18 outputs to the memory controller 3 address information on a word line WL selected in step ST12. The memory controller 3 stores this address information in the defective memory cell table 5.

In step ST15, the control circuit 18 determines whether or not all of the word lines WL have been selected. If all of the word lines WL have not been selected (step ST15; No), the processing returns to step ST11. In this manner, steps ST11 to ST14 are repeated until all of the word lines WL are selected. If all of the word lines WL have been selected (step ST15; Yes), the processing proceeds to step ST16.

In step ST16, the row selection circuit 11 and the column selection circuit 12 apply voltage VSS to all of the word lines WL and the bit lines BL.

In step ST17, the column selection circuit 12 selects one of the bit lines BL, and applies voltage Varb to this selected bit line BL.

In step ST18, the control circuit 18 determines whether or not a current of a predetermined magnitude has flowed through a selected bit line BL in a state set in steps ST16 and ST17. If a current of a predetermined magnitude is detected (step ST18; Yes), the processing proceeds to step ST19. If a current of a predetermined magnitude is not detected (step ST18; No), the processing proceeds to step ST20.

In step ST19, the control circuit 18 outputs to the memory controller 3 address information on a bit line BL selected in step ST17. The memory controller 3 stores this address information in the defective memory cell table 5. At this time, the memory controller 3 correlates address information on a bit line BL with address information on any of the word lines WL already stored in the defective memory cell table 5. In this way, address information on a defective memory cell can be specified.

In step ST20, the control circuit 18 determines whether or not all of the bit lines BL have been selected. If all of the bit lines BL have not been selected (step ST20; No), the processing returns to step ST16. In this manner, steps ST16 to ST19 are repeated until all of the bit lines BL are selected. If all of the bit lines BL have been selected (step ST20; Yes), the scan operation is terminated.

Figure 9:
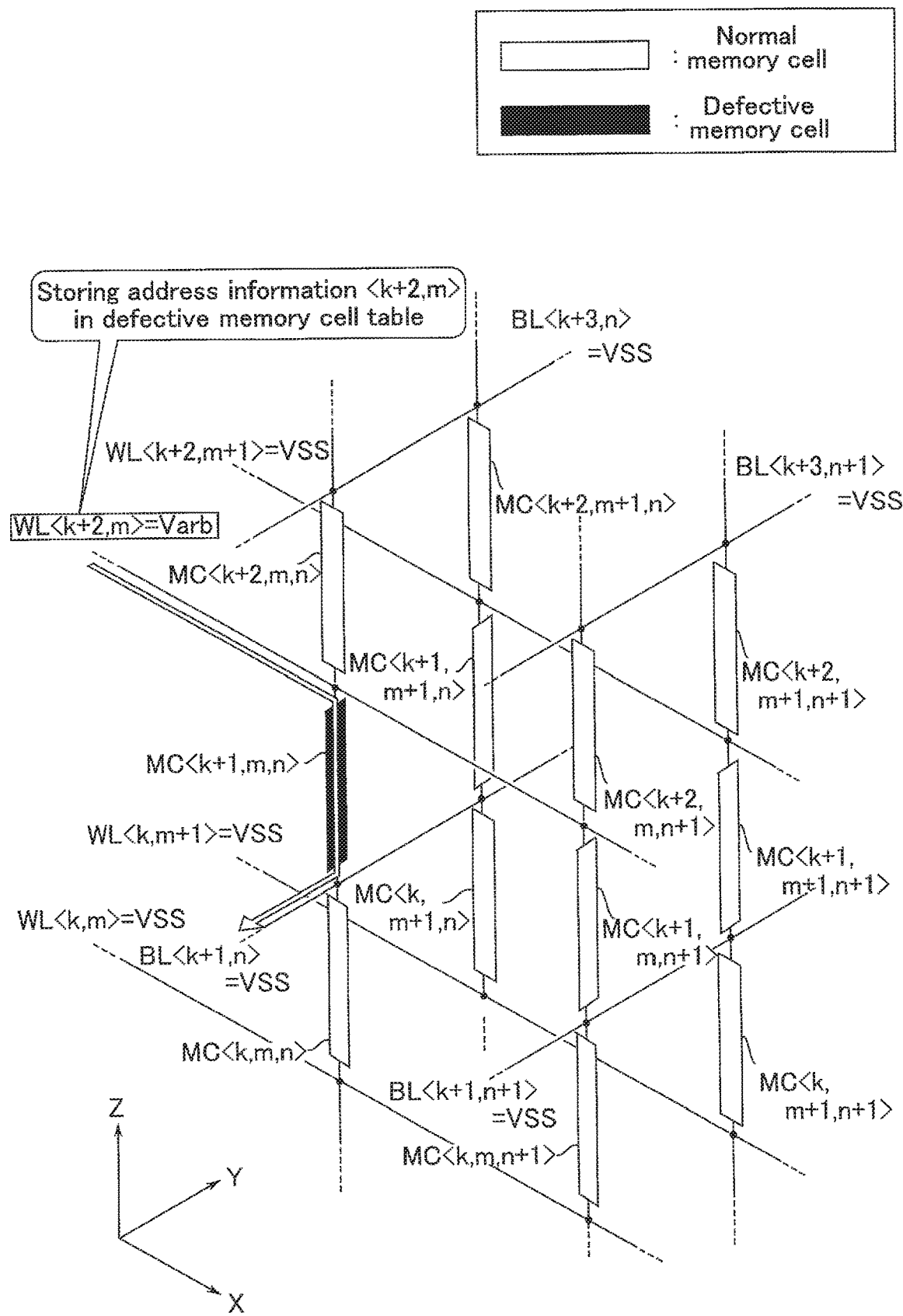
FIG. 9 is a schematic diagram illustrating a scan operation in the semiconductor memory device according to the embodiment.

FIGS. 9 and 10 are each a schematic diagram illustrating a scan operation in the semiconductor memory device according to the embodiment, and respectively correspond to steps ST11 to ST14 and steps ST16 to ST19 in FIG. 8.

FIGS. 9 and 10 each show four word lines WL, four bit lines BL, and twelve memory cells MC each positioned between one of the word lines WL and one of the bit lines BL. The four word lines WL are WL<k,m>, WL<k,m+1>, WL<k+2,m>, and WL<k+2,m+1>. The four bit lines BL are BL<k+1,n>, BL<k+1,n+1>, BL<k+3,n>, and BL<k+3,n+1>. FIGS. 9 and 10 each show a scan operation in the case where a memory cell MC<k+1,m,n> of the twelve memory cells MC corresponds to a defective memory cell MC.

First, an operation when a word line WL is selected will be described with reference to FIG. 9.

As shown in FIG. 9, if a word line WL<k+2,m> is selected, voltage Varb is applied to a plurality of memory cells (for example, a defective memory cell MC<k+1,m,n> and normal memory cells MC<k+1,m,n+1>, MC<k+2,m,n>, and MC<k+2,m,n+1>) connected to the word line WL<k+2,m>.

The respective switching elements SEL within the normal memory cells MC<k+1,m,n+1>, MC<k+2,m,n>, and MC<k+2,m, n+1> remain in an OFF state even in receipt of application of voltage Varb smaller than threshold voltage Vth. Therefore, a current does not flow through the normal memory cells MC<k+1,m,n+1>, MC<k+2,m,n>, and MC<k+2,m, n+1>.

On the other hand, the switching element SEL within the defective memory cell MC<k+1,m,n> is short-circuited and thus behaves, upon receipt of application of voltage Varb smaller than threshold voltage Vth, in the same manner as that in the ON state. This causes a current to flow by way of the defective memory cell MC<k+1,m,n>.

As described above, if voltage Varb is applied to the word line WL<k+2,m> and a current flows therethrough, it is understood that at least one of the memory cells MC connected to this word line WL<k+2,m> is a defective memory cell MC. Therefore, the control circuit 18 outputs address information <k+2,m> on the word line WL<k+2,m> to the memory controller 3, thereby storing it in the defective memory cell table 5.

Next, an operation when a bit line BL is selected will be described with reference to FIG. 10.

As shown in FIG. 10, if a word line BL<k+1,n> is selected, voltage Varb is applied to a plurality of memory cells (for example, a defective memory cell MC<k+1,m,n>, and normal memory cells MC<k+1,m+1,n>, MC<k,m,n>, and MC<k,m+1,n>) connected to the word line BL<k+1,n>.

The respective switching elements SEL within the normal memory cells MC<k+1,m+1,n>, MC<k,m,n>, and MC<k, m+1,n> remain in an OFF state even in receipt of application of voltage Varb smaller than threshold voltage Vth. Therefore, a current does not flow through the normal memory cells MC<k+1,m+1,n>, MC<k,m,n>, and MC<k,m+1,n>

On the other hand, the switching element SEL<k+1,m,n> within the defective memory cell MC<k+1,m,n> is short-circuited, and therefore, upon receipt of application of voltage Varb smaller than threshold voltage Vth, behaves in the same manner as that in the ON state. This causes a current to flow by way of the defective memory cell MC<k+1,m,n>.

As described above, if voltage Varb is applied to the bit line BL<k+1,n> and a current flows therethrough, it is understood that at least one of the memory cells MC connected to this bit line BL<k+1,n> is a defective memory cell MC. Therefore, the control circuit 18 outputs address information <k+1,n> on the bit line BL<k+1,n> to the memory controller 3, thereby storing it in the defective memory cell table 5.

This enables the memory controller 3 to determine that the memory cell MC<k+1,m,n> between address information <k+2,m> on a word line WL and address information <k+1,n> on a bit line BL both stored in the defective memory cell table 5 is a defective memory cell MC, and to store the address information in such a manner that the address information on the defective memory cell MC and the address information <k+2,m> and <k+1,n> are correlated with each other.

1.2.3 Access Operation

Next, an access operation will be described.

Figure 11:
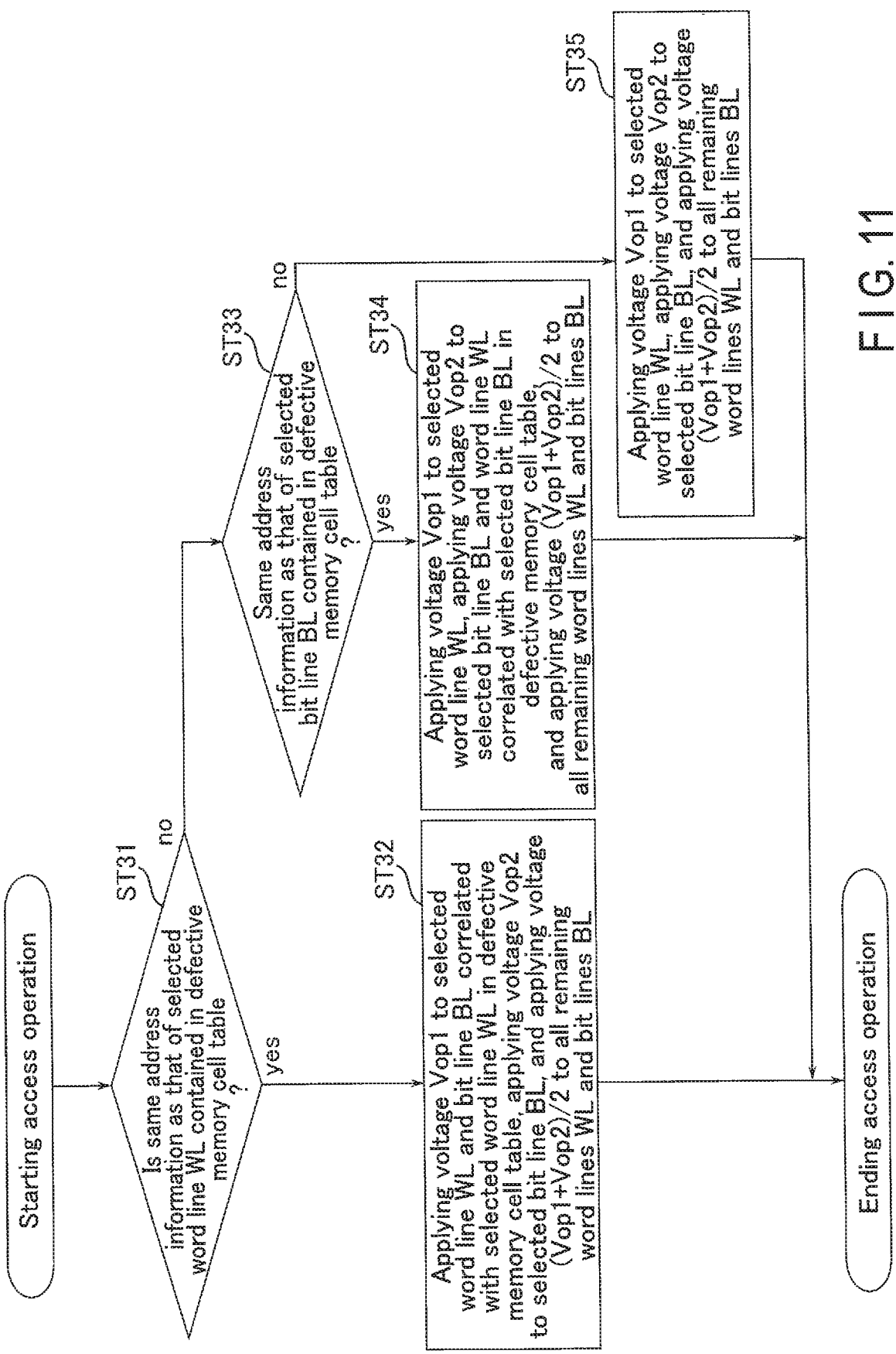
FIG. 11 is a flowchart illustrating an access operation in the semiconductor memory device according to the embodiment.

FIG. 11 is a flowchart illustrating an access operation in the semiconductor memory device according to the embodiment. FIG. 11 shows an operation of the memory controller 3 to determine which one of a first access command and a second access command to issue, and an operation in the semiconductor memory device 2 based on the determined access command.

First, the memory controller 3 determines which memory cell MC is an access target, and regards as a pair of a selected word line WL and a selected bit line BL a pair of a word line WL and a bit line BL both connected to a memory cell MC determined as the access target.

As shown in FIG. 11, in step ST31, the memory controller 3 refers to the defective memory cell table 5, thereby determining whether or not this table contains the same address information as that of the selected word line WL. If the defective memory cell table 5 contains the same address information as that of the selected word line WL (step ST31; Yes), the processing proceeds to step ST32. If not (step ST31; No), the processing proceeds to step ST33.

In step ST32, the memory controller 3 issues the second access command for the semiconductor memory device 2, thereby causing the semiconductor memory device 2 to execute an access operation. For example, the second access command includes, in addition to address information on both a selected word line WL and a selected bit line BL, address information on a bit line BL that is correlated with the selected word line WL and stored in the defective memory cell table 5. Upon receipt of the second access command, the semiconductor memory device 2 applies voltage Vop1 to both the selected word line WL and the bit line BL correlated with the selected word line WL within the defective memory cell table 5, voltage Vop2 to the selected bit line BL, and voltage (Vop1+Vop2)/2 to all of the remaining word lines WL and the remaining bit lines BL. Voltages Vop1 and Vop2 are respectively applied to a selected word line WL and a selected bit line BL in an access operation. Regarding the voltages Vop1 and Vop2, for example, one of them corresponds to voltage VSS, and the other corresponds to a write voltage or read voltage higher than voltage VSS. Half of the difference between voltages Vop1 and Vop2, |Vop1−Vop2|/2, is set to a value smaller than threshold voltage Vth of a switching element SEL (Vth>|Vop1−Vop2|/2).

In step ST33, the memory controller 3 refers to the defective memory cell table 5, thereby determining whether or not this table contains the same address information as that of the selected bit line BL. If the defective memory cell table 5 contains the same address information as that of the selected bit line BL (step ST33; Yes), the processing proceeds to step ST34. If not (step ST33; No), the processing proceeds to step ST35.

In step ST34, the memory controller 3 issues the second access command for the semiconductor memory device 2, thereby causing the semiconductor memory device 2 to execute an access operation. For example, the second access command includes, in addition to address information on both a selected word line WL and a selected bit line BL, address information on a word line WL that is correlated with the selected bit line BL and stored in the defective memory cell table 5. Upon receipt of the second access command, the semiconductor memory device 2 applies voltage Vop1 to the selected word line WL, voltage Vop2 to the selected bit line BL and the bit line BL correlated with the selected bit line BL within the defective memory cell table 5, and voltage (Vop1+Vop2)/2 to all of the remaining word lines WL and the remaining bit lines BL.

In step ST35, the memory controller 3 issues the first access command for the semiconductor memory device 2, thereby causing the semiconductor memory device 2 to execute an access operation. For example, the first access command includes address information on both a selected word line WL and a selected bit line BL.

Upon receipt of the first access command, the semiconductor memory device 2 applies voltage Vop1 to the selected word line WL, voltage Vop2 to the selected bit line BL, and voltage (Vop1+Vop2)/2 to all of the remaining word lines WL and the remaining bit lines BL.

This is the end of the access operation.

FIG. 11 illustrates the case in which the determination processing in step ST33 is executed after the determination processing in step ST31. However, the determination processing in step ST31 and determination processing in step ST33 may be executed in the reverse order or simultaneously.

Figure 12:
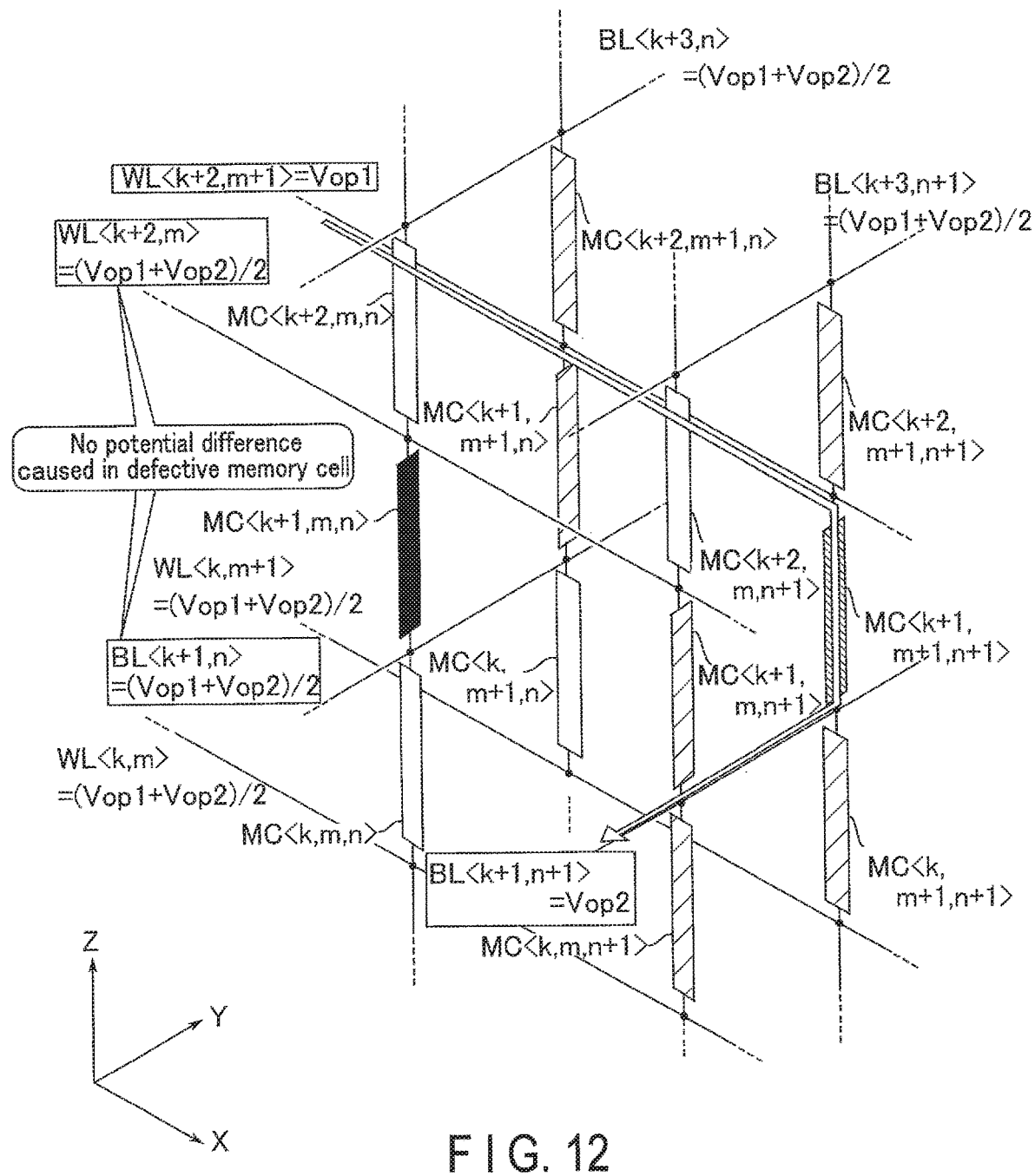
FIG. 12 is a schematic diagram illustrating an access operation in the semiconductor memory device according to the embodiment.
Figure 13:
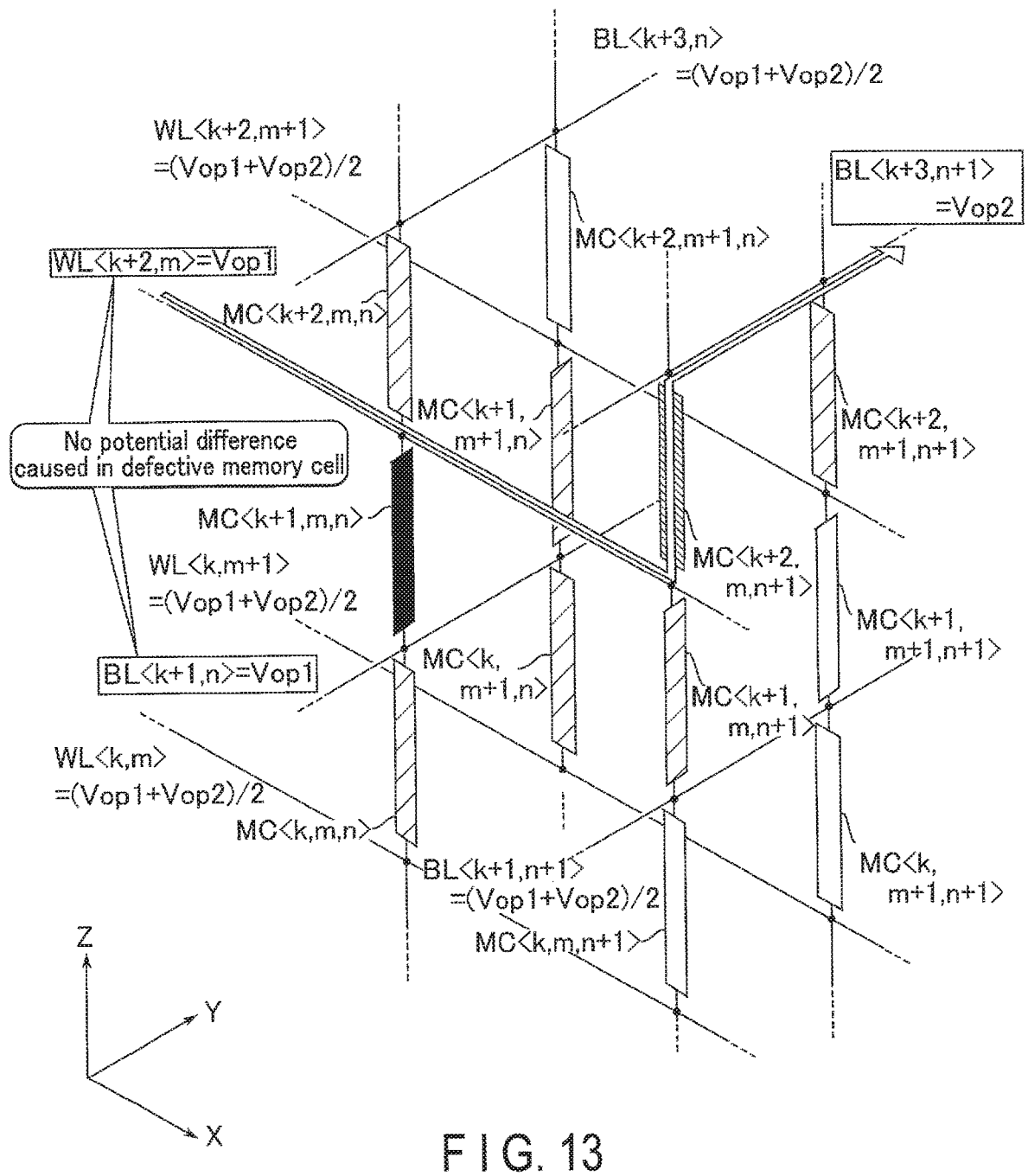
FIG. 13 is a schematic diagram illustrating an access operation in the semiconductor memory device according to the embodiment.
Figure 14:
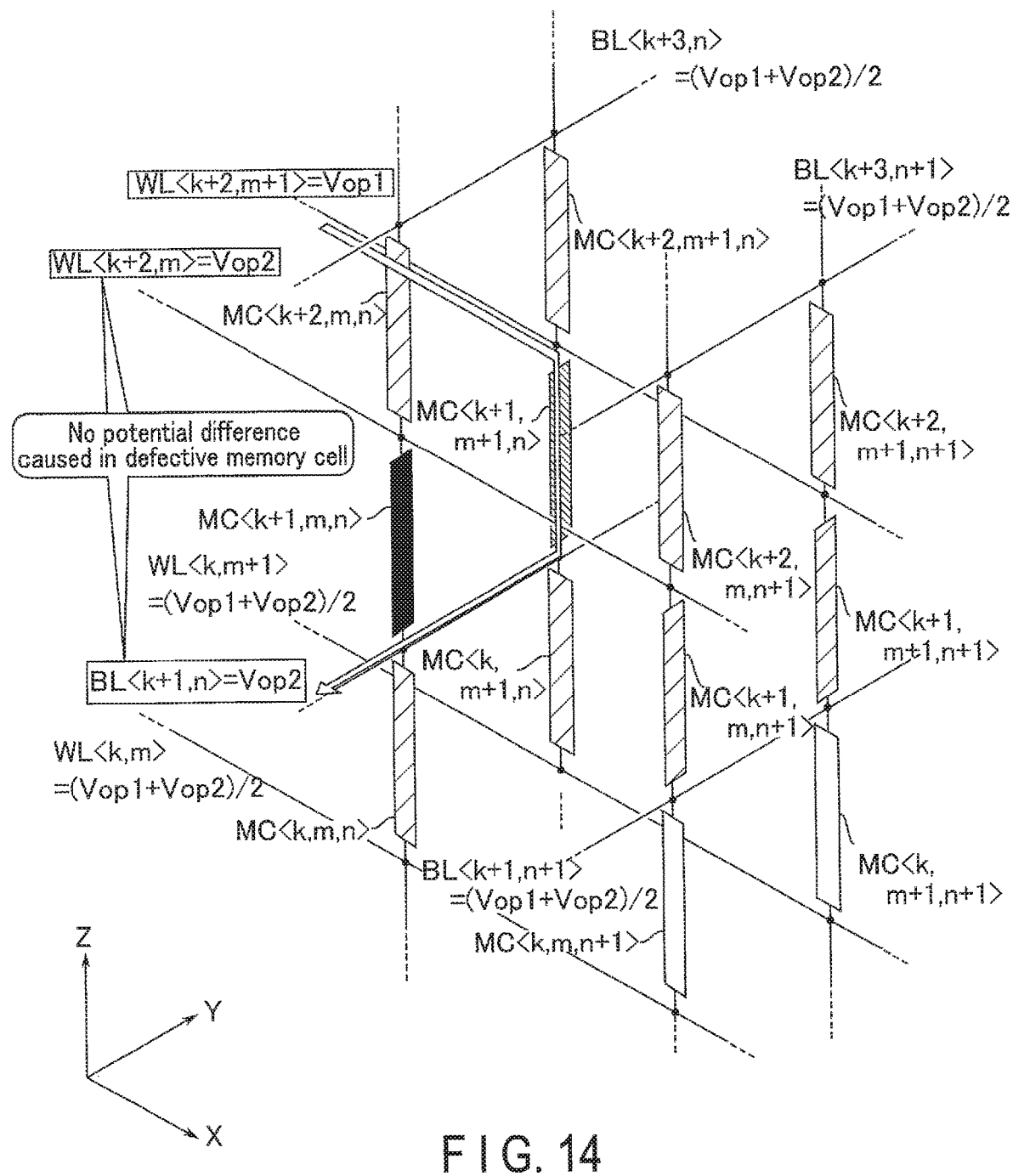
FIG. 14 is a schematic diagram illustrating an access operation in the semiconductor memory device according to the embodiment.

FIGS. 12 to 14 are each a schematic diagram illustrating the access operation in the semiconductor memory device according to the embodiment. FIG. 12 illustrates the word lines WL, the bit lines BL, and the memory cells MC in the access operation based on the first access command, and corresponds to step ST35 in FIG. 11. FIGS. 13 and 14 each illustrate word lines WL, bit lines BL, and memory cells MC in the access operation based on the second access command, and respectively correspond to steps ST32 and ST34 in FIG. 11. FIGS. 12 to 14 assume that a memory cell MC<k+1,m,n> corresponds to a defective memory cell MC, and that a pair of address information <k+2,m> on a word line WL<k+2,m> and address information <k+1,n> on a bit line BL<k+1,n> is stored in the defective memory cell table 5 in such a manner that this pair is correlated with the defective memory cell MC<k+1,m,n>.

First, the access operation based on the first access command will be described with reference to FIG. 12.

As shown in FIG. 12, for example, if a memory cell MC<k+1,m+1,n+1> is selected as an access target, a pair of a selected word line WL and a selected bit line BL corresponds to a word line WL<k+2,m+1> and a bit line BL<k+1,n+1>. In this case, neither address information <k+2,m+1> on the selected word line WL nor address information <k+1,n+1> on the selected bit line BL is stored in the defective memory cell table 5 (step ST31; No & step ST33; No). Thus, the memory controller 3 issues the first access command, thereby causing the semiconductor memory device 2 to execute the access operation based on the first access command.

The semiconductor memory device 2 applies voltage Vop1 to a selected word line WL<k+2,m+1> and voltage Vop2 to a selected bit line BL<k+1,n+1>. This causes a potential difference |Vop1−Vop2| in the selected memory cell MC<k+1,m+1,n+1>, thereby allowing access to the selected memory cell MC. The semiconductor memory device 2 applies voltage (Vop1+Vop2)/2 to all of the word lines WL other than the selected word line WL and to all of the bit lines BL other than the selected bit line BL. Accordingly, among the illustrated memory cells MC, memory cells MC<k+2,m+1,n>, MC<k+2,m+1,n+1>, MC<k+1,m+1,n>, MC<k+1,m,n+1>, MC<k,m,n+1>, and MC<k,m+1,n+1> have the occurrence of potential difference |Vop1−Vop2|/2, thereby entering a semi-selected state. However, as described above, the potential difference |Vop1−Vop2|/2 is smaller than threshold voltage Vth of a switching element SEL. Thus, a switching element SEL within a semi-selected memory cell MC remains in an OFF state, thereby preventing a current from flowing through the semi-selected memory cell MC. Among the illustrated memory cells MC, memory cells MC<k+2,m,n>, MC<k+2,m,n+1>, MC<k+1,m,n>, MC<k,m,n>, and MC<k,m+1,n>, including the defective memory cell MC, have no occurrence of a potential difference, thereby entering a non-selected state. This makes it possible to set a switching element SEL within a non-selected memory cell MC to an OFF state, to prevent a potential difference from occurring in a defective memory cell MC, and to prevent a current from flowing through the non-selected memory cell MC.

By the semiconductor memory device 2 operating as described above, the selected memory cell MC<k+1,m+1,n+1> can be accessed without allowing a current to flow through the defective memory cell MC<k+1,m,n> during the access operation corresponding to step ST35 in FIG. 11.

The operation described next with reference to FIG. 13 is the access operation based on the second access command in the case in which a selected word line WL corresponds to a defective memory cell MC.

As shown in FIG. 13, if the memory cell MC<k+2,m,n+1> is selected as an access target, for example, a pair of a selected word line WL and a selected bit line BL corresponds to a word line WL<k+2,m> and a bit line BL<k+3,n+1>. In this case, the selected word line WL and the selected bit line BL respectively exhibit address information <k+2,m> and <k+3,n+1>, and only address information <k+2,m> on the selected word line WL is stored in the defective memory cell table 5 (step ST31; Yes (and step ST33; No)). Thus, the memory controller 3 issues the second access command, thereby causing the semiconductor memory device 2 to execute the access operation based on the second access command.

The semiconductor memory device 2 applies voltage Vop1 to a selected word line WL<k+2,m> and to a bit line BL<k+1,n> correlated with the selected word line WL in the defective memory cell table 5, and voltage Vop2 to a selected bit line BL<k+3,n+1>. This causes the potential difference |Vop1−Vop2| in the selected memory cell MC<k+2,m+1,n+1>, thereby allowing access to the selected memory cell MC, and causes no potential difference in the defective memory cell MC<k+1,m,n>, thereby setting it to a non-selected state.

The semiconductor memory device 2 applies voltage (Vop1+Vop2)/2 to all of the word lines WL other than the selected word line WL and to all of the bit lines BL other than both of the selected bit line and the bit line BL<k+1,n>. Accordingly, among the illustrated memory cells MC, memory cells MC<k+2,m,n>, MC<k+2,m+1,n+1>, MC<k+1,m+1,n>, MC<k+1,m,n+1>, MC<k,m,n> and MC<k,m+1,n> have the occurrence of |Vop1−Vop2|/2, thereby entering a semi-selected state. However, as described above, the potential difference |Vop1−Vop2|/2 is smaller than threshold voltage Vth of a switching element SEL. Thus, a switching element SEL within a semi-selected memory cell MC remains in an OFF state, thereby preventing a current from flowing through the semi-selected memory cell MC.

Among the illustrated memory cells MC, memory cells MC<k+2,m+1,n>, MC<k+1,m+1,n+1>, MC<k,m,n+1>, and MC<k,m+1,n+1> have no occurrence of a potential difference, thereby entering a non-selected state. This prevents a current from flowing through a non-selected memory cell MC.

By the semiconductor memory device 2 operating as described above, the selected memory cell MC<k+2,m,n+1> can be accessed without allowing a current to flow through the defective memory cell MC<k+1,m,n> during the access operation corresponding to step ST32 in FIG. 11.

The operation described next with reference to FIG. 14 is the access operation based on the second access command in the case in which a selected bit line BL corresponds to a defective memory cell MC.

As shown in FIG. 14, if a memory cell MC<k+1,m+1,n> is selected as an access target, for example, a pair of a selected word line WL and a selected bit line BL corresponds to a word line WL<k+2,m+1> and a bit line BL<k+

1,n>. In this case, the selected word line WL and the selected bit line BL respectively exhibit address information <k+2, m+1> and <k+1,n>, and only address information <k+1,n> on the selected bit line BL is stored in the defective memory cell table 5 (step ST33; Yes (and step ST31; No)). Thus, the memory controller 3 issues the second access command, thereby causing the semiconductor memory device 2 to execute the access operation based on the second access command.

The semiconductor memory device 2 applies voltage Vop1 to a selected word line WL<k+2,m+1>, and voltage Vop2 to a selected bit line BL<k+1,n> and to a word line WL<k+2,m> correlated with the selected bit line BL in the defective memory cell table 5. This causes the potential difference |Vop1−Vop2| in the selected memory cell MC<k+1,m+1,n>, thereby allowing access to the selected memory cell MC, and causes no potential difference in the defective memory cell MC<k+1,m,n>, thereby setting it to a non-selected state.

The semiconductor memory device 2 applies voltage (Vop1+Vop2)/2 to all of the word lines WL other than both of the selected word line WL and the word line WL<k+2,m> and to all of the bit lines BL other than the selected bit line BL. Accordingly, among the illustrated memory cells MC, memory cells MC<k+2,m,n>, MC<k+2,m+1,n>, MC<k+2,m,n+1>, MC<k+2,m+1,n+1>, MC<k+1,m,n+1>, MC<k+1,m+1,n+1>, MC<k,m,n>, and MC<k,m+1,n> have the occurrence of potential difference |Vop1−Vop2|/2, thereby entering a semi-selected state. However, as described above, the potential difference |Vop1−Vop2|/2 is smaller than threshold voltage Vth of a switching element SEL. Thus, a switching element SEL within a semi-selected memory cell MC remains in an OFF state, thereby preventing a current from flowing through the semi-selected memory cell MC. Among the illustrated memory cells MC, memory cells MC<k,m,n+1> and MC<k,m+1,n+1> have no occurrence of a potential difference, thereby entering a non-selected state. This prevents a current from flowing through a non-selected memory cell MC.

By the semiconductor memory device 2 operating as described above, the selected memory cell MC<k+1,m+1,n> can be accessed without allowing a current to flow through the defective memory cell MC<k+1,m,n> during the access operation corresponding to step ST34 in FIG. 11.

Assume that two memory cells MC both having the same layer address k and each having a different pair of a row address m and a column address n are defective memory cells MC. In this case, setting of a single memory cell MC to a selected state may not be realized even in accordance with the flowchart shown in FIG. 11. Specifically, for example, assume that there are two defective memory cells MC<k,$m_a$,$n_a$> and MC<k,$m_b$,$n_b$>. In this case, if only the memory cell MC<k,$m_a$,$n_b$> is selected, not only the memory cell MC<k,$m_a$,$n_b$> but also the memory cell MC<k,$m_b$,$n_a$> may be simultaneously set to a selected state. Even if the above condition occurs, it is only required that, in addition to these two defective memory cells MC, memory cells MC<k,$m_a$,$n_b$> and MC<k,$m_b$,$n_a$> be deemed to be unavailable.

1.3 Advantageous Effects of Present Embodiment

According to the embodiment, when executing the access operation with respect to a selected memory cell MC, the memory controller 3 refers to the defective memory cell table 5, thereby determining whether or not the defective memory cell table 5 stores address information on a selected word line WL and a selected bit line BL. If either address information on a selected word line WL or address information on a selected bit line BL is stored in the defective memory cell table 5, the memory controller 3 issues the second access command. If both are not stored, the memory controller 3 issues the first access command. Accordingly, the semiconductor memory device 2 enables voltages applied to a word line WL and a bit line BL to be varied between the case of receiving the first access command and the case of receiving the second access command.

Specifically, upon receipt of the first access command, the control circuit 18 applies voltage Vop1 to a selected word line WL. Furthermore, upon receipt of the first access command in the access operation on a selected memory cell MC in which voltage Vop2 is applied to a selected bit line BL, the control circuit 18 applies voltage (Vop1+Vop2)/2 to all of the non-selected word lines WL and the non-selected bit lines BL. This makes it possible to set a selected memory cell MC to a selected state, a defective memory cell MC to a non-selected state, and all of the memory cells other than the selected memory cell MC and the defective memory cell MC to a non-selected state or a semi-selected state.

On the other hand, the second access command includes address information on a bit line correlated with a selected word line WL in the defective memory cell table 5, or address information on a word line WL correlated with a selected bit line BL. This enables, upon receipt of the second access command, the semiconductor memory device 2 to recognize that the defective memory cell MC is connected to the selected word line WL or the selected bit line BL. In addition, the semiconductor memory device 2 is configured to recognize address information on a bit line BL connected to a selected word line WL via the defective memory cell MC, or address information on a word line WL connected to a selected bit line BL via the defective memory cell MC.

In the case of receiving the second access command including address information on a bit line BL connected to a selected word line WL via the defective memory cell MC, the control circuit 18 applies voltage Vop1 to the bit line BL and selected word line WL, and voltage Vop2 to a selected bit line BL. In the case of receiving the second access command including access information on a word line WL connected to a selected bit line BL via the defective memory cell MC, the control circuit 18 applies voltage Vop2 to the word line WL and selected bit line BL, and voltage Vop1 to a selected word line WL. This makes it possible to set a selected memory cell MC to a selected state, a defective memory cell MC to a non-selected state, and all of the memory cells other than the selected memory cell MC and the defective memory cell MC to a non-selected state or a semi-selected state.

As described above, regardless of which one of the first access command and the second access command is received, the semiconductor memory device 2 can prevent a current from flowing through a defective memory cell MC, while allowing an appropriate current to flow through a selected memory cell MC. This allows access to a normal memory cell regardless of the presence or absence of a defective memory cell MC.

Furthermore, upon receipt of the scan command, the semiconductor memory device 2 selects either a word line WL or a bit line BL and applies voltage Varb to the selected line, while applying voltage VSS to all of the remaining word lines WL and bit lines BL. Herein, voltage Varb is set to be lower than threshold voltage Vth of a switching element SEL. In this condition, the semiconductor memory device 2 determines whether or not a current of a predetermined magnitude flows through a selected word line WL or bit line BL. Accordingly, whether a defective memory cell MC is connected or not to a selected word line WL or a bit line BL can be determined. The semiconductor memory device 2 executes this scan operation on all of the memory cells MC in accordance with a scan command from the memory controller 3 or a tester, and outputs a result of the execution to the memory controller 3 or stores it in the memory cell array 10. This enables the memory controller 3 to determine, in the access operation to be executed after the above scan operation, whether to issue the first access command or the second access command, based on a result of the scan operation. This allows access to a normal memory cell regardless of the presence or absence of a defective memory cell MC.

2. Modification

The above embodiment is not a limitation, and various modifications are applicable.

In the case described in the embodiment described above, a word line WL and a bit line BL are scanned separately in the scan operation. However, this is not a limitation. Specifically, a word line WL and a bit line BL may be scanned simultaneously.

Figure 15:
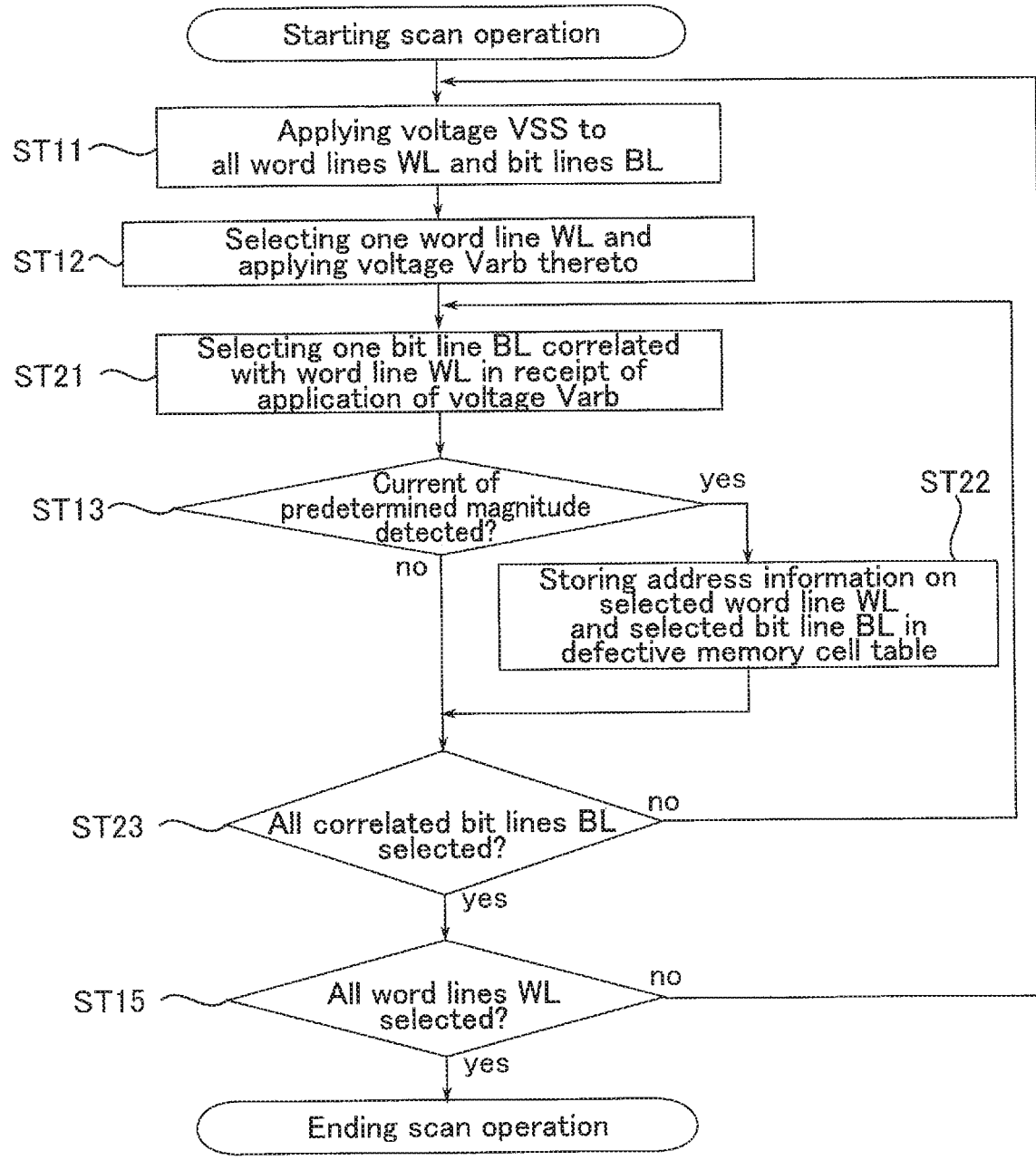
FIG. 15 is a flowchart illustrating a scan operation in the semiconductor memory device according to a modification of the embodiment.

FIG. 15 is a flowchart illustrating a scan operation in the semiconductor memory device according to a modification of the embodiment. FIG. 15 differs from FIG. 8 in that steps ST16 to ST20 are omitted, step ST21 is added between steps ST12 and ST13, step ST14 is replaced with step ST22, and step ST23 is added between steps ST13 and ST15.

As shown in FIG. 15, in steps ST11 and ST12, the row selection circuit 11 and the column selection circuit 12 apply voltage Varb to one of word lines WL, and apply voltage VSS to all of the remaining word lines WL and bit lines BL.

In step ST21, the column selection circuit 12 selects one of bit lines BL which are connected via memory cells MC to the word line WL to which voltage Varb has been applied (i.e., one of the bit lines BL correlated with the word line WL to which voltage Varb has been applied). Specifically, for example, the column selection circuit 12 sets to an ON state a select transistor (not shown) connected to a bit line BL connected via a memory cell MC to the word line WL to which voltage Varb has been applied, while setting to an OFF state select transistors connected to respective remaining bit lines BL other than the aforementioned bit line BL.

In step ST13, the control circuit 18 determines whether or not a current of a predetermined magnitude has flowed through a selected word line WL and a selected bit line BL in a state set in steps ST11, ST12, and ST21. If a current of a predetermined magnitude is detected (step ST13; Yes), the processing proceeds to step ST22. If a current of a predetermined magnitude is not detected (step ST13; No), the processing proceeds to step ST23.

In step ST22, the control circuit 18 outputs to the memory controller 3 address information on a word line WL selected in step ST12 and address information on a bit line BL selected in step ST21. The memory controller 3 correlates, as a pair, the aforementioned address information on the word line WL selected with the aforementioned address information on the bit line BL in the defective memory cell table 5, and stores them in the defective memory cell table 5.

In step ST23, the control circuit 18 determines whether or not all of the bit lines BL correlated with the word line WL selected in step ST12 have been selected. If all of the bit lines BL have not been selected (step ST23; No), the processing returns to step ST21. In this manner, steps ST21, ST13, and ST22 are repeated until all of the bit lines BL correlated with the word line WL selected in step ST12 are selected. If all of the bit lines BL have been selected (step ST23; Yes), the processing proceeds to step ST15.

In step ST15, the control circuit 18 determines whether or not all of the word lines WL have been selected. If all of the word lines WL have not been selected (step ST15; No), the processing returns to step ST11. In this manner, steps ST1l to ST23 are repeated until all word lines WL are selected. If all of the word lines WL have been selected (step ST15, Yes), the scan operation is terminated.

By operating in a manner described above, the semiconductor memory device 2 can simultaneously specify a word line WL and a bit line BL both connected to a defective memory cell MC.

3. Others

In the memory cells MC described in the above embodiment and its modification, a magnetic tunnel junction element MTJ is provided below a switching element SEL. However, the magnetic tunnel junction element MTJ may be provided above the switching element SEL. Furthermore, a magnetic tunnel junction element MTJ and a switching element SEL may be formed in such a manner that their upper and lower relationship is reversed between the case of an odd-numbered layer address k and the case of an even-numbered layer address k.

The magnetic tunnel junction element MTJ described in the above embodiment and its modification has a top-free structure in which the storage layer SL is provided above the reference layer RL. However, this is not a limitation. For example, the magnetic tunnel junction element MTJ may have a bottom-free structure in which the storage layer SL is provided below the reference layer RL. In such a case, a write current for data "1" and data "0" has a reverse direction to that of a write current for data "1" and data "0" in the case of the top-free structure shown in FIG. 5.

In the embodiment and its modification described above, as an example, an MRAM which stores data using a magnetic tunnel junction element MTJ is described as a resistance change element. However, this is not a limitation.

For example, the embodiment and its modification are applicable to a resistance change type memory similar to an MRAM, for example a semiconductor memory device having an element that stores data using a resistance change, such as a ReRAM (Resistive Random Access Memory) and a PCRAM (Phase-Change Random Access Memory).

In addition, the embodiments are applicable to a semiconductor memory device including an element that can store data by a resistance change caused by application of a current or voltage, or can read data stored by converting a resistance difference caused by the resistance change into a current difference or a voltage difference, regardless of whether the memory device is a volatile memory or a nonvolatile memory.

While certain embodiments have been described, these embodiments have been presented by way of example only, and are not intended to limit the scope of the inventions. Indeed, the embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit.

What is claimed is:

1. A semiconductor memory device comprising:
a first memory cell and a first switching element coupled in series between a first interconnect and a second interconnect;
a second memory cell and a second switching element coupled in series between the first interconnect and a third interconnect;
a third memory cell and a third switching element coupled in series between the first interconnect and a fourth interconnect; and
a control circuit, wherein:
the control circuit is configured to:
in a first operation on the first memory cell, the first operation including applying a first voltage to the first interconnect and applying a second voltage to the second interconnect,
responsive to receipt of a first command to execute the first operation, apply a third voltage having a level between a level of the first voltage and a level of the second voltage to the third interconnect and the fourth interconnect; and
responsive to receipt of a second command to execute the first operation, apply the first voltage to the fourth interconnect, while applying the third voltage to the third interconnect.

2. The device of claim 1, wherein the second command contains address information on the fourth interconnect.

3. The device of claim 1, wherein the control circuit is configured to, upon receipt of a third command, execute a second operation including:
selecting one of the second interconnect, the third interconnect, and the fourth interconnect;
while applying a fourth voltage to the selected interconnect, applying a fifth voltage to the first interconnect and all non-selected interconnects of the second interconnect, the third interconnect, and the fourth interconnect; and
outputting address information on the selected interconnect to outside of the semiconductor memory device if a current flowing through the selected interconnect exceeds a threshold value.

4. The device of claim 3, wherein the control circuit is configured to, in the second operation, repeat the selecting, the applying, and the outputting until all interconnects are selected.

5. The device of claim 3, wherein the fourth voltage is lower than respective threshold voltages of the first switching element, the second switching element, and the third switching element.

6. The device of claim 1, further comprising:
a fourth memory cell and a fourth switching element coupled in series between a fifth interconnect and the second interconnect; and
a fifth memory cell and a fifth switching element coupled in series between a sixth interconnect and the second interconnect,
wherein the control circuit is configured to:
in the first operation on the first memory cell,
responsive to receipt of the first command, further apply the third voltage to the fifth interconnect and the sixth interconnect; and
responsive to receipt of the second command, while applying the third voltage to the fifth interconnect, apply the second voltage to the sixth interconnect.

7. The device of claim 6, wherein the second command contains address information on the fourth interconnect and the sixth interconnect.

8. The device of claim 1, wherein the first operation includes a write operation or a read operation.

9. The device of claim 1, wherein each of the first memory cell, the second memory cell, and the third memory cell includes a magnetic tunnel junction element.

10. The device of claim 1, wherein each of the first switching element, the second switching element, and the third switching element is a two-terminal switching element.

11. A memory system comprising:
a semiconductor memory device; and
a memory controller configured to issue a first command and a second command to the semiconductor memory device, wherein:
the semiconductor memory device includes:
a first memory cell and a first switching element coupled in series between a first interconnect and a second interconnect;
a second memory cell and a second switching element coupled in series between the first interconnect and a third interconnect;
a third memory cell and a third switching element coupled in series between the first interconnect and a fourth interconnect; and
a control circuit, and
the control circuit is configured to:
in a first operation on the first memory cell, the first operation including applying a first voltage to the first interconnect and applying a second voltage to the second interconnect,
responsive to receipt of the first command to execute the first operation, apply a third voltage having a level between a level of the first voltage and a level of the second voltage to the third interconnect and the fourth interconnect; and
responsive to receipt of the second command to execute the first operation, apply the first voltage to the fourth interconnect, while applying the third voltage to the third interconnect.

12. The memory system of claim 11, wherein the second command contains address information on the fourth interconnect.

13. The memory system of claim 11, wherein:
the memory controller is configured to further issue a third command, and
the control circuit is configured to, upon receipt of the third command, execute a second operation including:
selecting one of the second interconnect, the third interconnect, and the fourth interconnect;
while applying a fourth voltage to the selected interconnect, applying a fifth voltage to the first interconnect and all non-selected interconnects of the second interconnect, the third interconnect, and the fourth interconnect; and
outputting address information on the selected interconnect to outside of the semiconductor memory device if a current flowing through the selected interconnect exceeds a threshold value.

14. The memory device of claim 13, wherein the memory controller is configured to determine, based on address information output from the semiconductor memory device in the second operation, which one of the first command and the second command is to be issued in the first operation.

15. The memory system of claim 13, wherein the memory controller is configured to issue the third command when the semiconductor memory device is started up, or after a predetermined period elapses from issuance of the third command.

16. The memory system of claim 13, wherein the control circuit is configured to, in the second operation, repeat the selecting, the applying, and the outputting until all interconnects are selected.

17. The memory system of claim 13, wherein the fourth voltage is lower than respective threshold voltages of the first switching element, the second switching element, and the third switching element.

18. The memory system of claim 11, wherein the semiconductor memory device further includes:
- a fourth memory cell and a fourth switching element coupled in series between a fifth interconnect and the second interconnect; and
- a fifth memory cell and a fifth switching element coupled in series between a sixth interconnect and the second interconnect, and wherein the control circuit is configured to:
in the first operation on the first memory cell,
responsive to receipt of the first command, further apply the third voltage to the fifth interconnect and the sixth interconnect; and
responsive to receipt of the second command, while applying the third voltage to the fifth interconnect, apply the second voltage to the sixth interconnect.

19. The memory system of claim 18, wherein the second command contains address information on the fourth interconnect and the sixth interconnect.

20. The memory system of claim 11, wherein the first operation includes a write operation or a read operation.

* * * * *